US008217734B2

(12) United States Patent
Peyton et al.

(10) Patent No.: US 8,217,734 B2
(45) Date of Patent: *Jul. 10, 2012

(54) APPARATUSES AND METHODS FOR COUPLING A SIGNAL TO AND/OR FROM A CABLE

(75) Inventors: Anthony Peyton, Bolton (GB); John Kelly, Morecambe (GB)

(73) Assignee: Cable Sense Limited, Manchester (GB)

( * ) Notice: Subject to any disclaimer, the term of this patent is extended or adjusted under 35 U.S.C. 154(b) by 0 days.

This patent is subject to a terminal disclaimer.

(21) Appl. No.: 13/079,722

(22) Filed: Apr. 4, 2011

(65) Prior Publication Data

US 2011/0181374 A1 Jul. 28, 2011

Related U.S. Application Data

(63) Continuation of application No. 12/420,787, filed on Apr. 8, 2009, now Pat. No. 8,008,986.

(30) Foreign Application Priority Data

Mar. 27, 2009 (GB) .................................. 0905361.2

(51) Int. Cl.
*H01P 5/00* (2006.01)
*H03H 7/42* (2006.01)
*H01P 3/00* (2006.01)

(52) U.S. Cl. ..................... 333/24 R; 333/25; 333/245

(58) Field of Classification Search ............. 333/24 R, 333/25, 245
See application file for complete search history.

(56) References Cited

U.S. PATENT DOCUMENTS

| | | | |
|---|---|---|---|
| 3,831,086 | A | 8/1974 | Pesto |
| 5,854,824 | A | 12/1998 | Bengal et al. |
| 6,115,468 | A | 9/2000 | De Nicolo |
| 6,218,930 | B1 | 4/2001 | Katzenberg et al. |
| 7,573,254 | B2 | 8/2009 | Cobb et al. |
| 7,602,695 | B2 * | 10/2009 | Berkman ............ 370/201 |
| 7,705,606 | B2 | 4/2010 | Peyton et al. |
| 2006/0262727 | A1 | 11/2006 | Caveney |

FOREIGN PATENT DOCUMENTS

| | | |
|---|---|---|
| EP | 0700193 A2 | 6/1996 |
| GB | 2459224 B | 8/2010 |
| WO | 2009049291 A1 | 4/2009 |

OTHER PUBLICATIONS

Dorai, S., et al. "Evaluation of Differential and Common—Mode Transmission Through UTP Cables Using FE Techniques" International Wire & Cable Symposium, Proceeding of the 56th IWCS, pp. 512-517, 2007.

Elliot, Barry J., "Cable Engineering for Local Area Networks," pp. 102-013, 2000.

IEEE Computer Society, "Carrier Sense Multiple Access with Collision Detection (CSMA/CD) Access Method & Physical Layer Specification," IEEE Std 802.3af, 1-133, 2003.

* cited by examiner

*Primary Examiner* — Dean O Takaoka
(74) *Attorney, Agent, or Firm* — Lathrop & Gage LLP

(57) ABSTRACT

Apparatuses and methods for coupling a signal to and from a twisted pair cable by non-contact coupling with twisted pairs in the twisted pair cable, such that the signal propagates along the cable between at least two of the twisted pairs. In particular, a coupling unit for coupling a voltage signal to and/or from such a cable, the coupling unit having a first electrode and a second electrode. The electrodes may be electrically isolated from a voltage signal generator and/or a voltage signal processor.

14 Claims, 15 Drawing Sheets

APPARATUSES AND METHODS FOR COUPLING A SIGNAL TO AND/OR FROM A CABLE

CROSS-REFERENCE TO RELATED APPLICATIONS

This application is a continuation of U.S. patent application Ser. No. 12/420,787, filed Apr. 8, 2009 which claims benefit of priority to Great Britain Patent Application Number 0905361.2 filed 27 Mar. 2009, which is incorporated herein by reference.

FIELD

This invention relates to apparatuses and methods for coupling a signal to and/or from a cable which includes a plurality of twisted pairs. In particular, this invention relates to coupling a signal to and/or from such a cable by non-contact coupling with the cable. Such signals may be used to determine interconnections, e.g. within a local area network.

BACKGROUND

Cables which include a plurality of twisted pairs, referred to as "twisted pair cables" herein, are well known. Such cables are commonly used for telecommunications purposes, e.g. computer networking and telephone systems. In the field of telecommunications, twisted pair cables are usually provided without shielding, i.e. as unshielded twisted pair (UTP) cables. However, shielded twisted pair (STP) cables are also known.

In this context, a "twisted pair" is a pair of conductors, usually a forward conductor and a return conductor of a single circuit, which have been twisted together. The conductors are usually twisted together for the purposes of cancelling out electromagnetic interference from external sources and to minimise cross-talk between neighbouring twisted pairs within a cable comprising a plurality of twisted pairs. In this way, each twisted pair provides a reliable respective communication channel for a signal, usually a differential voltage signal, to be conveyed within the twisted pair. Common forms of unshielded twisted pair cables are category 5 and category 6 unshielded twisted pairs which include eight conductors twisted together in pairs to form four twisted pairs.

The design and construction of twisted pair cables is carefully controlled by manufacturers to reduce noise due to electromagnetic interference and to reduce cross-talk between the twisted pairs within the cables. To this end, each twisted pair in a twisted pair cable normally has a different twist rate (i.e. number of twists per unit length along the cable) from that of the other twisted pairs in the cable. It is also usual for the twisted pairs to be twisted around each other within the cable. Fillets or spacers may be used to separate physically the twisted pairs.

Local area networks (LANs) are also well known. Local area networks are typically used to enable equipment such as computers, telephones, printers and the like to communicate with each other and with remote locations via an external service provider. Local area networks typically utilise twisted pair network cables, usually in the form of unshielded twisted pair cables.

The network cables in a local area network are typically connected to dedicated service ports throughout one or more buildings. The network cables from the dedicated service ports can extend through the walls, floor and/or ceilings of the building to a communications hub, typically a communications room containing a number of network cabinets. The network cables from wall and floor sockets within the building and from an external service provider are also usually terminated within the communications room.

A "patch system" may be used to interconnect various network lines of the local area network within the network cabinets. In a patch system, all of the network lines can be terminated within the network cabinets in an organized manner. The terminations of the network lines are provided by the structure of the network cabinets, which are typically organised in a rack system. The racks contain "patch panels", which themselves utilise sets of network ports, typically RJ45-type connector ports, at which the network lines terminate.

Each of the network ports in each patch panel is hard wired to one of the local area network's network lines. Accordingly, each network line is terminated on a patch panel in an organized manner. In small patch systems, all network lines may terminate on the patch panels of the same rack. In larger patch systems, multiple racks are used, wherein different network lines terminate on different racks.

The interconnections between the various network lines are made using "patch cables", which are typically unshielded twisted pair cables including four twisted pairs. Each end of a patch cable is terminated by a connector, such as an RJ-45 type connector for inserting into an RJ-45 type connector port as described above. One end of the patch cable is connected to the network port of a first network line and the opposite end of the patch cable is connected to the network port of a second network line. By selectively connecting the various network lines using the patch cables, a desired combination of network interconnections can be achieved.

FIG. 1 shows a typical patch system organised into a server row 82, a cross-connect row 83 and a network row 84, which include patch panels 80a, 80b, 80c, 80d. Patch cables 10a, 10b, 10c, 10d are used to interconnect two network lines through the patch system.

In many businesses, employees are assigned their own computer network access number so that the employee can interface with the companies IT infrastructure. When an employee changes office locations, it is not desirable to provide that employee with newly addressed network port. Rather, to preserve consistency in communications, it is preferred that the exchanges of the network ports in the employee's old office be transferred to the telecommunications ports in the employee's new location. This type of move is relatively frequent. Similarly, when new employees arrive and existing employees depart, it is usually necessary for the patch cables in the network cabinet(s) to be rearranged so that each employee's exchanges can be received in the correct location.

As the location of employees change, the patch cables in a typical cabinet are often manually entered in a computer based log. This is burdensome. Further, technicians often neglect to update the log each and every time a change is made. Accordingly, the log is often less than 100% accurate and a technician has no way of reading where each of the patch cables begins and ends. Accordingly, each time a technician needs to change a patch cable, that technician manually traces that patch cable between an internal line and an external line. To perform a manual trace, the technician locates one end of a patch cable. The technician then manually follows the patch cable until he/she finds the opposite end of that patch cable. Once the two ends of the patch cable are located, the patch cable can be positively identified.

It takes a significant amount of time for a technician to manually trace a particular patch cable, especially in large patch systems. Furthermore, manual tracing is not completely accurate and a technician may accidently go from one patch cable to another during a manual trace. Such errors result in misconnected patch cables which must be later identified and corrected.

Attempts have been made in the prior art to provide an apparatus which can automatically trace the common ends of each patch cable within local area networks, thereby reducing the labour and inaccuracy of manual tracing procedures.

For example, U.S. Pat. No. 5,483,467 describes a patching panel scanner for automatically providing an indication of the connection pattern of the data ports within a local area network, so as to avoid the manual task of identifying and collecting cable connection information. In one embodiment, which is intended for use with shielded twisted pair cables, the scanner uses inductive couplers which are associated with the data ports. The inductive coupler is disclosed as being operative to impose a signal on the shielding of shielded network cables in order to provide an indication of the connection pattern produced by connection of the cables to a plurality of ports.

In another embodiment of U.S. Pat. No. 5,483,467, the scanner is coupled to each data port by "dry contact" with a dedicated conductor in a patch cable. This is difficult to implement in practice, because most network cables have to meet a particular pre-determined standard in the industry, such as RJ45, in which there is no free conductor which could be used for determining interconnectivity.

U.S. Pat. No. 6,222,908 discloses a patch cable identification and tracing system in which the connectors of each patch cable contain a unique identifier which can be identified by a sensor in the connector ports of a telecommunications closet. By reading the unique identifier on the connectors of each patch cable, the system can keep track of which patch chords are being added to and removed from the system. Although this system avoids the use of dedicated conductors in the patch cable, it is difficult to implement because it requires use of non-standard patch cables, i.e. patch cables with connectors containing unique identifiers.

International Patent Application Publication Number WO00/60475 discloses a system for monitoring connection patterns of data ports. This system uses a dedicated conductor which is attached to the external surface of a network cable in order to monitor the connection pattern of data ports. Although this allows the system to be used with standard network cables, it still requires the attaching of dedicated conductors to the external surfaces of network cables and adapter jackets which are placed over the standard network cable.

U.S. Pat. No. 6,285,293 discloses another system and method for addressing and tracing patch cables in a dedicated telecommunications system. The system includes a plurality of tracing interface modules that attach to patch panels in a telecommunications closet. On the patch panels, are located a plurality of connector ports that receive the terminated ends of patch cables. The tracing interface modules mount to the patch panels and have a sensor to each connector port which detects whenever a patch cable is connected to the connector port. A computer controller is connected to the sensors and monitors and logs all changes to the patch cable interconnections in an automated fashion. However, this system cannot be retrofitted to an existing network and relies on the operator to work in a particular order if the patch cable connections are to be accurately monitored.

International Patent Application Publication Number WO2005/109015, which relates to the field of cable state testing, discloses a method of determining the state of a cable comprising at least one electrical conductor and applying a generated test signal to at least one conductor of the cable by a non-electrical coupling transmitter. The reflected signal is then picked up and compared with expected state signal values for the cable, so that the state of the cable can be determined. The inventors have found that signals coupled to a twisted pair cable by the methods described in WO2005/109015 have a tendency to leak out from the twisted pair cable, especially when other twisted pair cables are nearby.

SUMMARY

The present invention has been devised in light of the above considerations.

The present invention generally relates to a discovery by the inventors that a twisted pair cable, e.g. an unshielded twisted pair (UTP) cable, provides communication channels which are additional to the respective communication channel provided within each twisted pair in the cable. In particular, it has been found that additional communication channels exist between each combination of two twisted pairs within a twisted pair cable, due to coupling between the twisted pairs. This is surprising because, as explained above, twisted pair cables are designed so as to minimise cross-talk, i.e. to minimise the coupling, between the twisted pairs. Each combination of two twisted pairs within a twisted pair cable may be termed a "pair-to-pair" combination. Therefore, the additional communication channels may be termed "pair-to-pair" channels.

It has been found that a signal which propagates along a twisted pair cable between two of the twisted pairs can propagate reliably and over useful distances, without significantly altering the transmission of signals within the individual twisted pairs. In other words, such a signal can propagate in addition to the differential voltage signals which typically propagate within each twisted pair when the twisted pair cable is in use. It is presently considered that it is the ordered geometry typically found in twisted pair cables which allows signals to propagate usefully between two twisted pairs.

Accordingly, in general, the invention provides apparatuses and methods for coupling a signal to and from a twisted pair cable by non-contact coupling with twisted pairs in the twisted pair cable, such that the signal propagates along the cable between at least two of the twisted pairs.

When it is described that the signal propagates along a twisted pair cable "between two of the twisted pairs", it is meant that the signal propagates along the cable due to a coupling between the two twisted pairs, the signal being a difference in state between the two twisted pairs.

For example, the signal may be a voltage signal, i.e. a difference in voltage between the two twisted pairs, which propagates along the cable due to a capacitive coupling between the two twisted pairs. As another example, the signal may propagate along the cable due to an inductive coupling between the two twisted pairs.

Accordingly, a signal which propagates between two twisted pairs is distinguished from a so-called "common mode" signal. As discussed in more detail below, it is also possible to convey a common mode voltage signal along a twisted pair cable, the common mode voltage signal being a difference in voltage between all the conductors in the twisted pair cable and a ground voltage. However, in such a common mode voltage signal, there is on average no difference in voltage between any two of the twisted pairs in the twisted pair cable, and therefore the common mode voltage signal should not be seen as a voltage signal which propagates along a cable between two of the twisted pairs.

By "non-contact" coupling, it is intended to mean a coupling which does not involve direct electrical contact, i.e. does not involve ohmic contact.

The inventors have found that a voltage signal which propagates along a twisted pair cable between twisted pairs can be non-contact coupled to and/or from the cable by a pair of electrodes, i.e. by a first electrode and a second electrode.

To couple a voltage signal to the cable using a pair of electrodes, a voltage signal, e.g. from a voltage signal generator, may be coupled to the electrodes so that the electrodes produce an electric field therebetween. The electric field thus produced may cause a voltage to be developed between two of the twisted pairs adjacent the electrodes, thereby coupling the voltage signal to the cable so that the voltage signal propagates between at least two of the twisted pairs.

A voltage signal which propagates between at least two twisted pairs in a twisted pair cable may have an electric field associated with it. To receive the voltage signal, this electric field may cause a voltage to be developed between the electrodes, thereby coupling the voltage signal from the cable to the electrodes. The received voltage signal may subsequently be coupled to a voltage signal processor, for example.

A first aspect of the invention relates to a discovery by the inventors that the quality of a voltage signal which propagates between twisted pairs and is coupled to and/or from a twisted pair cable by a pair of electrodes can be improved by electrically isolating the electrodes from a voltage signal generator (when the electrodes are used to couple a voltage signal generated by the voltage signal generator to the cable) and/or by electrically isolating the electrodes from a voltage signal processor (when the voltage signal processor is used to process a voltage signal received from the cable by the electrodes). In particular, it has been found that coupling a voltage signal to a twisted pair cable using electrically isolated electrodes can help to reduce leakage of the voltage signal from the cable.

The inventors do not wish to be bound by theory, but it is thought that the improvement in signal quality may derive from a capacitive coupling between the electrically isolated electrodes and the twisted pairs such that the average voltage of the electrodes corresponds to the average voltage of the conductors which form the twisted pairs. It is also thought that the same coupling may cause the average voltage of the electrodes to track the average voltage of the conductors which form the twisted pairs over time. In other words, it is thought that the improvement may derive from the voltages of the electrodes being "balanced" with respect to the voltages of the conductors which form the twisted pairs.

It is also thought that the same coupling may also lead to the voltage signal which propagates along the cable between the twisted pairs having an average voltage which corresponds to, and which tracks over time, the average voltage of the conductors which form the twisted pairs, i.e. so that the average voltage of the voltage signal which propagates along the cable is "balanced" with respect to the voltages in the conductors which form the twisted pairs.

Accordingly, the first aspect of the invention provides for example a coupling unit according to claim 1.

The electrical isolation means may be any suitable means for electrically isolating the electrodes of the coupling unit from the voltage signal generator and/or the voltage signal processor, whilst still allowing the voltage signal to be coupled between the electrodes and the voltage signal generator and/or the voltage signal processor. The electrical isolation means may therefore include a transformer. Preferably, the electrical isolation means includes a balun.

The voltage signal coupling means may be any means suitable for coupling a voltage signal between the electrodes and a voltage signal generator and/or voltage signal processor. The voltage signal coupling means may therefore include one or more conductors.

Preferably, the coupling unit includes shielding for shielding the electrodes from an external electromagnetic field. In this way, the external electromagnetic field can be inhibited from interfering with the coupling between the electrically isolated electrodes and the cable. The presence of shielding has been found to improve the quality of a voltage signal which is coupled to and/or from a twisted pair cable by the electrodes, especially in environments where there are significant external electromagnetic fields. The shielding may include an electrostatic screen.

It has been found to be preferable to couple a signal to the cable by coupling a differential voltage signal to the electrodes (a voltage signal including two complimentary voltage signals), rather than a single-ended voltage signal (a voltage signal including a single voltage signal with respect to a fixed voltage, e.g. ground).

Accordingly, the voltage signal coupling means may include a converting means for converting a single-ended voltage signal from a voltage signal generator into a differential voltage signal to be coupled to the electrodes. In other embodiments, the voltage signal generator may be able to generate a differential voltage signal.

The converting means may additionally or alternatively be for converting a differential voltage signal from the electrodes into a single-ended voltage signal to be coupled to a voltage signal processor. In other embodiments, the voltage signal processor may be able to process a differential voltage signal.

The electrical isolating means may electrically isolate the electrodes from the converting means. The converting means may include a choke.

Preferably, the coupling unit has housing in which the electrodes, and optionally any one or more of the voltage signal coupling means, the electrical isolating means, the shielding and the converting means, is housed.

The first and second electrodes may be spaced apart by the housing so as to allow the cable to be received therebetween. Preferably, the first and second electrodes are spaced apart by the housing so as to be located on directly opposite sides of the cable when the cable is received therebetween. In this way, the electric field produced between the first and second electrodes of the transmitter can couple more easily with twisted pairs located on opposite sides of the cable.

The housing may be arranged to be clipped on to the cable. Preferably, the electrodes are located in the housing so as to contact an outer surface of the cable if the housing is clipped onto the cable. In this way, the electrodes can be located in close proximity with the cable, simply by clipping a coupling unit onto the cable. The coupling unit(s) may be arranged to clip onto the cable by any suitable means, e.g. a channel in the coupling unit or retention lugs.

Preferably, each electrode includes a respective contact surface for contacting an outer surface of the cable. Preferably, each contact surface substantially conforms in shape to an outer surface of the cable. For example, in the case of a cable with a round, e.g. generally circular, cross-section, the or each contact surface may have a curvature which substantially conforms to an outer surface of the cable. Therefore each electrode may be cylindrical or partially cylindrical in cross section. In this way, the distance between the electrodes and the twisted pairs in the cable can be minimised so as to improve the coupling between the electrodes and the twisted pairs.

The coupling unit may include an amplifier, e.g. for amplifying a voltage signal to be coupled to the cable or for amplifying a voltage signal which has been coupled from the cable. The amplifier may be housed by the housing.

The coupling unit may include a third electrode and a fourth electrode, which are preferably spaced apart from the first and second electrodes, and are preferably arranged to produce an electric field therebetween to couple the voltage signal to the cable by non-contact coupling with the twisted pairs so that the voltage signal propagates between at least two of the twisted pairs. Additionally or alternatively, the third and fourth electrodes may be arranged to receive a voltage signal which has propagated along the cable between at least two of the twisted pairs by non-contact coupling with at least two of the twisted pairs between which the voltage signal has propagated. The inventors have found that this can improve the strength of the signal coupled to and/or coupled from the cable. The third and fourth electrodes may have any of the features associated with the first and second electrodes of the transmitter and described herein.

Although the first and second electrodes may in principle be arranged to couple a voltage signal to and from the cable, the first and second electrodes may be arranged only to couple a voltage signal to the cable, in which case: the first electrode and the second electrode are arranged to produce an electric field therebetween to couple a voltage signal to the cable by non-contact coupling with the twisted pairs so that the voltage signal propagates along the cable between at least two of the twisted pairs; the voltage signal coupling means is for coupling a voltage signal generated by a voltage signal generator to the electrodes; and the electrical isolation means is arranged to electrically isolate the electrodes of the coupling unit from the voltage signal generator.

In addition to electrodes arranged only to couple a voltage signal to the cable, the coupling unit may have additional electrodes arranged only to couple a voltage signal from the cable. Accordingly, the coupling unit may have: a first additional electrode and a second additional electrode arranged to receive a voltage signal which has propagated along the cable between at least two of the twisted pairs by non-contact coupling with at least two of the twisted pairs between which the voltage signal has propagated; and a voltage signal coupling means for coupling a voltage signal received by the additional electrodes to a voltage signal processor; wherein the voltage signal coupling means includes electrical isolation means arranged to electrically isolate the additional electrodes of the coupling unit from the voltage signal processor. The first and second additional electrodes may have any of the features described in connection with reference to the first and second electrodes.

In other embodiments, the first and second electrodes may be arranged only to couple a voltage signal from the cable, in which case: the first electrode and the second electrode are arranged to receive a voltage signal which has propagated along the cable between at least two of the twisted pairs by non-contact coupling with at least two of the twisted pairs between which the voltage signal has propagated; the voltage signal coupling means is for coupling a voltage signal received by the electrodes to a voltage signal processor; and the electrical isolation means is arranged to electrically isolate the electrodes of the coupling unit from the voltage signal processor.

The voltage signal coupling means may couple (directly or indirectly) a voltage signal generator to the electrodes of the coupling unit. The voltage signal generator may be arranged to generate a voltage signal to be coupled to the cable by the electrodes. Therefore, there may be provided an apparatus having: a coupling unit as described herein; and a voltage signal generator; wherein the voltage signal coupling means couples the voltage signal generator to the electrodes of the coupling unit.

The voltage signal generator may be arranged to generate a single-ended voltage signal, e.g. to be converted into a differential voltage signal by a converting means. In some embodiments, the voltage signal generator may be arranged to generate a differential voltage signal.

The voltage signal generator may be arranged to generate a data signal which contains data, e.g. digital data. In this way, two of the coupling units can be used to transmit data from a first location to a second location along the twisted pair cable.

The data signal may contain address data to identify the coupling unit. This is particularly useful if the apparatus is to be used to identify an interconnection between two coupling units, as described in more detail below.

The voltage signal generator may be arranged to generate a test signal for determining a state of the cable. For example, the test signal may be a signal that is suitable for use in reflectometry. Reflectometry techniques are well-known in the art and include time domain reflectometry and frequency domain reflectometry. Accordingly, the test signal may be suitable for performing time domain reflectometry or frequency domain reflectometry. Some reflectometry techniques are described, for example, in International Patent Application Publication Number WO2005/109015.

It has been found that performing reflectometry with signals which propagate between at least two twisted pairs in a cable can produce particularly clear results compared with performing reflectometry with signals which propagate within individual twisted pairs in a twisted pair cable.

The voltage signal coupling means may couple (directly or indirectly) a voltage signal processor to the electrodes of the coupling unit. The voltage signal processor may be arranged to process a voltage signal received by the electrodes. Therefore, there may be provided an apparatus having: a coupling unit as described herein; and a voltage signal processor; wherein the voltage signal coupling means couples the voltage signal processor to the electrodes of the coupling unit.

The same electrodes could be coupled to both a voltage signal generator and a voltage signal processor, e.g. if the same electrodes are to be used for coupling a signal to and coupling a signal from the cable.

The voltage signal processor may be arranged to receive a single-ended voltage signal, e.g. converted from a differential voltage signal by the coupling unit. In some embodiments, the voltage signal processor may be arranged to receive a differential voltage signal.

The voltage signal processor may include a data retrieving means for retrieving data from a data signal received by the receiver, e.g. by decoding and/or demodulating a signal received by the receiver.

The voltage signal processor may be arranged to determine a state of a cable based on a test signal received by the receiver. For example, the voltage signal processor may be arranged to determine a state of the cable by comparing a received signal with a reference signal, as is known in the art of reflectometry.

There may be provided an apparatus having: a cable including a plurality of twisted pairs; a first coupling unit for coupling a voltage signal to the cable; a second coupling unit for coupling the voltage signal from the cable. The first and second coupling units may have any of the features described herein in connection with coupling units. The cable may be an unshielded twisted pair cable, e.g. including eight conductors twisted together to form four twisted pairs. Such cables are well known.

The first and second coupling units may be located at different positions along the cable. This allows the first and second coupling units to be used to transmit data along the cable, e.g. if the voltage signal is a data signal. If the voltage signal is a test signal, it may be useful to have the first and second coupling units located at a similar or the same position along the cable, e.g. to perform reflectometry.

A second aspect of the invention generally relates to an apparatus for coupling a signal which propagates between twisted pairs to and from a twisted pair cable. Accordingly, a second aspect of the invention may provide for example an apparatus for coupling a signal to and from a cable.

Prior art apparatuses known to the inventors are not arranged to receive a signal which has propagated between twisted pairs.

For example, International Patent Application Publication Number WO2005/109015, described above, discloses a method of applying a generated test signal to at least one conductor of a twisted pair cable by a non-electrical coupling transmitter, picking up a reflected signal and comparing it with expected state signal values for the cable to determine its current state. However, this patent application does not disclose an apparatus arranged to receive a signal which has propagated along a twisted pair cable between at least two twisted pairs.

The signal may be a voltage signal, i.e. with the first coupling unit arranged to couple a voltage signal to the cable and the second coupling unit arranged to couple the voltage signal from the cable.

For reasons explained above, it is currently thought that an improvement in the quality of a voltage signal coupled to and/or from a twisted pair cable may derive from a voltage signal which propagates along the cable between twisted pairs having an average voltage which corresponds to, and which may track over time, the average voltage of the conductors which form the twisted pairs.

Accordingly, the first coupling unit may be arranged such that the voltage signal which propagates between at least two of the twisted pairs has an average voltage which corresponds to the average voltage in the conductors which form the twisted pairs. The first coupling unit may further be arranged such that the voltage signal which propagates between at least two of the twisted pairs has an average voltage which tracks the average voltage in the conductors which form the twisted pairs over time.

The first coupling unit may have a first electrode and a second electrode arranged to produce an electric field therebetween to couple a voltage signal to the cable by non-contact coupling with the twisted pairs so that the voltage signal propagates along the cable between at least two of the twisted pairs.

The first coupling unit may be arranged such that the first and second electrodes have an average voltage which corresponds to the average voltage in the conductors which form the twisted pairs, e.g. to improve the quality of the voltage signal which propagates between twisted pairs for reasons discussed above. The first coupling unit may be arranged such that the first and second electrodes have an average voltage which tracks the average voltage in the conductors which form the twisted pairs over time, e.g. to improve the quality of the voltage signal which propagates between twisted pairs for reasons discussed above.

The first coupling unit may have or be associated with any of the features described with reference to the first aspect of the invention. However, the electrical isolating means described with reference to the first aspect may be omitted, since it has been found that it is still possible to couple a voltage signal to a twisted pair cable with the electrical isolating means omitted, even though this may lead to a reduction in the quality of the voltage signal which propagates between the twisted pair.

The second coupling unit may have a first electrode and a second electrode arranged to receive a voltage signal which has propagated along the cable between at least two of the twisted pairs by non-contact coupling with at least two of the twisted pairs between which the voltage signal has propagated.

The second coupling unit may be arranged such that the first and second electrodes have an average voltage which corresponds to the average voltage in the conductors which form the twisted pairs, e.g. to improve the quality of the voltage signal received by the second coupling unit for reasons discussed above. The second coupling unit may be arranged such that the first and second electrodes have an average voltage which tracks the average voltage in the conductors which form the twisted pairs over time, e.g. to improve the quality of the voltage signal received by the second coupling unit for reasons discussed above.

The second coupling unit may have or be associated with any of the features described with reference to the first aspect of the invention. However, the electrical isolating means described with reference to the first aspect may be omitted, since it has been found that it is still possible to couple a voltage signal from a twisted pair cable with the electrical isolating means omitted, even though the quality of the voltage signal may be reduced.

The second aspect of the invention may provide a first coupling unit for coupling a signal to a cable including a plurality of twisted pairs having any of the features described above or may provide a second coupling unit for coupling a signal from a cable having any of the features described above.

A third aspect of the invention relates to using a plurality of the coupling units described herein to determine interconnections by twisted pair cables, e.g. in a local area network. An advantage of using the coupling units described herein to determine interconnections by twisted pair cables is that the signals which are coupled to and from a twisted pair cable by such coupling units can propagate in addition to the differential voltage signals which are typically present within each twisted pair when the twisted pair cables are in use. In this way, interconnections can be determined using a standard twisted pair cable.

Accordingly, the third aspect of the invention may provide an apparatus having: one or more first coupling units for coupling a signal to a cable including a plurality of twisted pairs so that the signal propagates along the cable between at least two of the twisted pairs; one or more second coupling units for coupling a signal which has propagated between at least two twisted pairs from a cable including a plurality of twisted pairs; and an interconnection determining means arranged to determine one or more interconnections between any one of the first coupling units and any one of the second coupling units by one or more cables including a plurality of twisted pairs The first coupling unit may have or be associated with any of the features described in the first and/or second aspects of the invention, e.g. it may be arranged to couple a signal to the cable by non-contact coupling with the twisted pairs so that the signal propagates along the cable between at least two of the twisted pairs. The second coupling unit may have or be associated with any of the features described in the first and/or second aspects of the invention, e.g. it may be arranged to receive a signal which has propagated along a cable including a plurality of twisted pairs by non-contact coupling with at least two of the twisted pairs between which the signal has propagated.

Although both the first and the second coupling units may be arranged to non-contact couple with a cable including a plurality of twisted pairs, it is possible for only the first coupling units or only the second coupling units to be arranged to non-contact couple with a cable including a plurality of twisted pairs. In this case, the coupling units which are not arranged to non-contact couple with the twisted pairs may be arranged to couple with the twisted pairs by direct electrical, i.e. ohmic, contact. A preferred arrangement may have the one or more first coupling units being arranged to couple with the twisted pairs by direct electrical contact. Where the apparatus is for use in a local area network, the one or more coupling units which are arranged to couple with the twisted pairs by direct electrical contact could be integrated within a known type of network apparatus, e.g. a switch unit.

The interconnection determining means is preferably arranged to determine an interconnection between one of the first coupling units and one of the second coupling units by determining if a second coupling unit couples a signal from a cable which has been coupled to the cable by the first coupling unit. In other words, the coupling of a signal from the cable by a second coupling unit, which signal has been coupled to the cable by a first coupling unit, is preferably used by the interconnection determining means to identify an interconnection between the first and second coupling unit.

The interconnection determining means may be a suitably programmed processing means, e.g. computer, connected to the first coupling unit(s) and second coupling unit(s).

Each of the one or more first coupling units may be arranged to couple to the cable a data signal containing address data to identify the first coupling unit. In this way, the signal received by the second coupling unit can be used to identify the first coupling unit which coupled the signal to the cable. The first coupling unit may be arranged to couple the data signal to the cable by being coupled to a voltage signal generator, for example.

Preferably, the apparatus is for determining interconnections between network ports in a local area network. Accordingly, each of the one or more first coupling units and each of the one or more second coupling units may be associated with a respective network port in a local area network. Furthermore, the interconnection determining means may be arranged to determine one or more interconnections between the network ports by one or more cables including a plurality of twisted pairs. In this way, the apparatus can be used to determine interconnections between network ports by patch cables in a local area network, without requiring the use of special patch cables or special patch panels and without the transmission of differential voltage signals within each twisted pair necessarily being interrupted.

The apparatus may include one or more signal units. Each signal unit may include a plurality of the first coupling units and/or a plurality of the second coupling units. The signal unit may include a voltage signal generator and/or a voltage signal processor. The invention may provide one of the signal units on its own. The signal unit may be integrated within a known type of network apparatus, e.g. a network switch.

A fourth aspect of the invention provides a kit of parts for forming an apparatus as set out in any one of the first, second or third aspects of the invention.

A fifth aspect of the invention generally relates to methods of coupling a signal to and/or from a cable including a plurality of twisted pairs using any apparatus disclosed herein, particularly those apparatuses described in connection with the above aspects of the invention.

Accordingly, the fifth aspect of the invention may provide a method of coupling a voltage signal to and/or from a cable including a plurality of twisted pairs, the method including: producing an electric field to couple a voltage signal to the cable by non-contact coupling with the twisted pairs so that the voltage signal propagates along the cable between at least two of the twisted pairs; and/or receiving a voltage signal which has propagated along the cable between at least two of the twisted pairs by non-contact coupling with at least two of the twisted pairs between which the voltage signal has propagated.

The fifth aspect of the invention may provide a method of coupling a signal to and from a cable including a plurality of twisted pairs, the method including: coupling a signal to the cable by non-contact coupling with the twisted pairs so that the signal propagates along the cable between at least two of the twisted pairs; and receiving the signal which has propagated along the cable by non-contact coupling with at least two of the twisted pairs between which the signal has propagated.

The invention also includes any combination of the aspects and preferred features described except where such a combination is clearly impermissible or expressly avoided.

BRIEF DESCRIPTION OF THE DRAWINGS

Examples of our proposals are discussed below, with reference to the accompanying drawings in which:

FIG. 5b is a representation of two of the pairs of the electrodes shown in FIG. 5a.

DETAILED DESCRIPTION OF THE EMBODIMENTS

Figure 1:
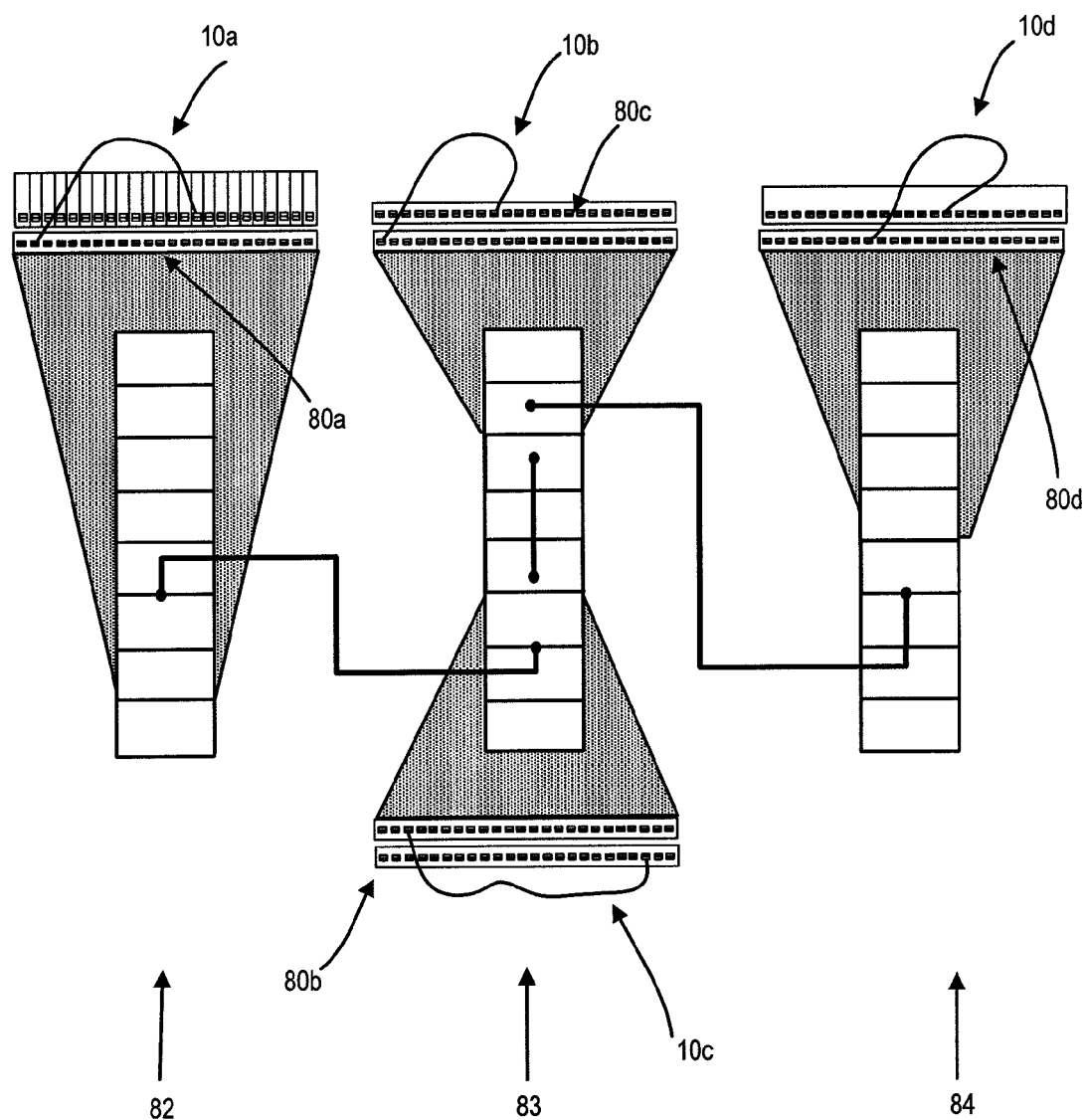
FIG. 1 is a representation of a patch system.
Figure 2A:
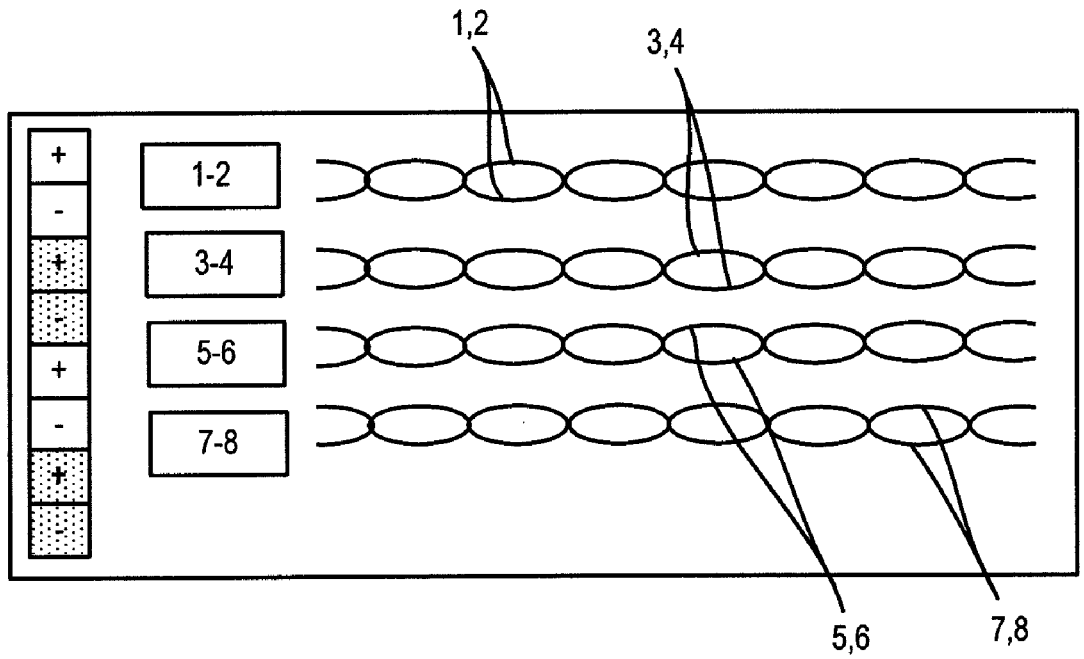
FIGS. 2a and 2b are representations of a twisted pair cable illustrating the difference between propagation of differential voltage signals within the twisted pairs of the twisted pair cable and the propagation of a common mode voltage signal in the twisted pair cable.
Figure 2B:
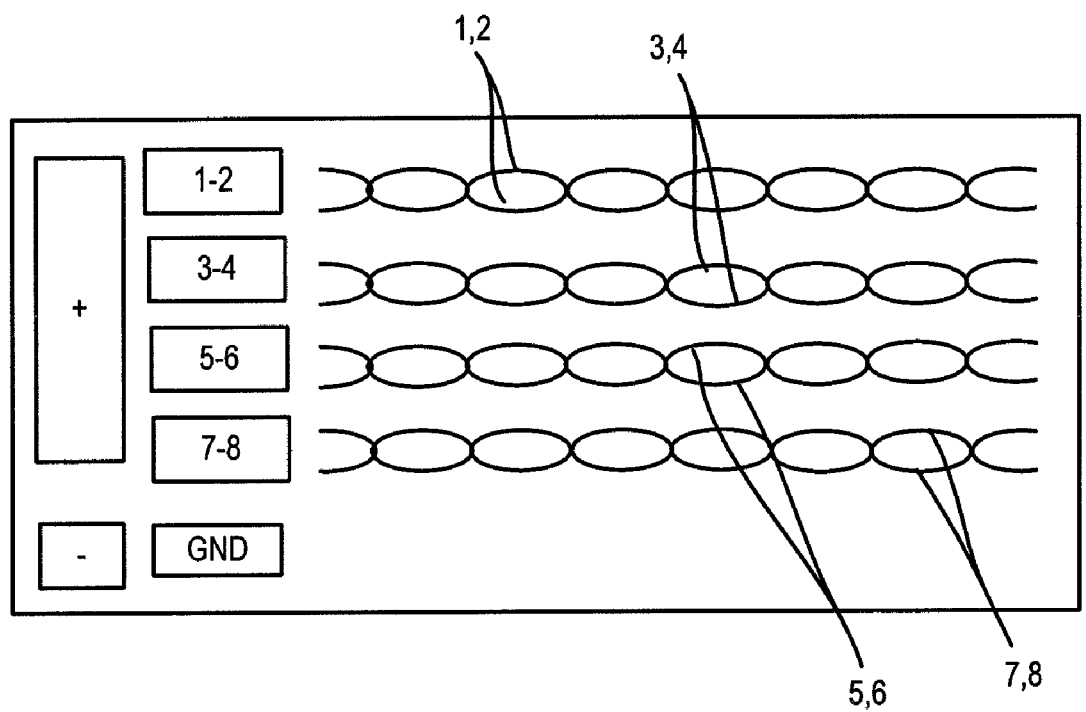

FIGS. 2a and 2b each show a twisted pair cable having eight conductors 1 to 8 which are twisted together in pairs to form four twisted pairs 1-2, 3-4, 5-6, 7-8.

In FIG. 2a, the twisted pair cable is being used as it was originally intended to be used, i.e. with a respective differential voltage signal propagating within each of the twisted pairs 1-2, 3-4, 5-6, 7-8. When the twisted pair cable is being used in this way, the two conductors in each twisted pair act as the forward (+) and the return (−) path of a single circuit, and therefore allow a differential voltage signal to propagate within the twisted pair. The differential voltage signal propagating within each twisted pair can be considered as the difference in voltage between the conductors in the twisted pair, e.g. as V1−V2, V3−V4, V5−V6 or V7−V8, where V1 to V8 represents the voltages in conductors 1 to 8 with respect to a reference voltage.

Twisted pair cables are typically very carefully designed and constructed such that each twisted pair has a desired characteristic impedance, e.g. 100 Ohms, and so that the differential voltage signal which propagates within each twisted pair has a desired velocity of propagation, e.g. 0.7 times the speed of light in vacuum.

In FIG. 2b, the twisted pair cable is being used such that a common mode voltage signal is propagating through the twisted pair cable. When a common mode voltage signal is propagating, all of the conductors in the twisted pairs act as the forward (+) path of the circuit, with a local ground (GND) acting as the return (−) path for the circuit. The common mode voltage signal can be considered as the difference in voltage between all the conductors and the local ground, e.g. as (V1+V2+V3+V4+V5+V6+V7+V8)/8, where V1 to V8 represents the voltages in conductors 1 to 8 with respect to the local ground.

Figure 3A:
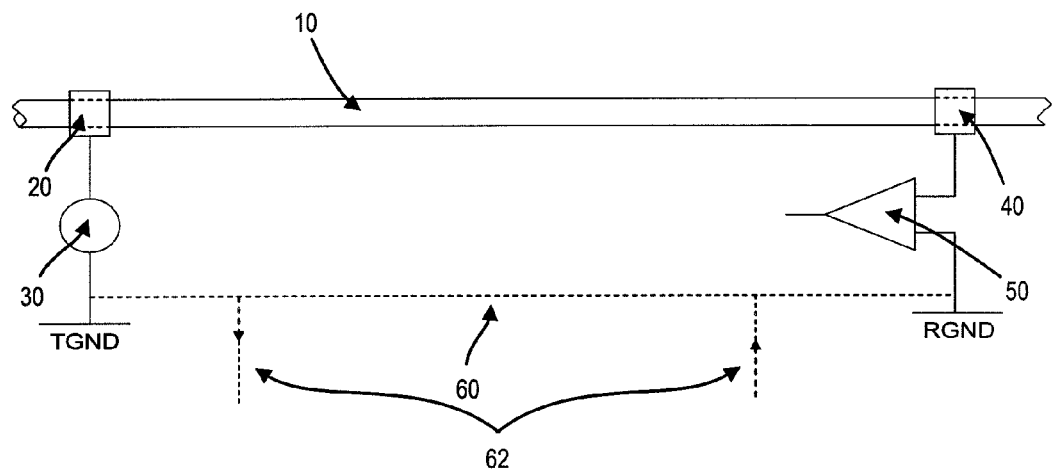
FIGS. 3a and 3b are representations of an apparatus for coupling a common mode voltage signal to and from a twisted pair cable.

FIG. 3a shows an apparatus for coupling a common mode voltage signal to and from a twisted pair cable 10. The twisted pair cable 10 shown in FIG. 3a is an unshielded twisted pair cable including four twisted pairs. The apparatus includes a first coupling unit 20 for coupling a common mode voltage signal to the twisted pair cable 10 at a first location on the twisted pair cable 10, and a second coupling unit 40 for coupling a common mode voltage signal from the twisted pair cable 10 at a second location on the twisted pair cable 10. The first coupling unit 20 is connected to a voltage source 30 for generating a single-ended voltage signal to be coupled to the twisted pair cable 10 by the first coupling unit 20. The second coupling unit 40 is connected to an amplifier 50 for amplifying a voltage signal coupled from the twisted pair cable 10 by the second coupling unit 40.

Also shown in FIG. 3a is a local ground TGND for the first coupling unit 20 and a local ground RGND for the second coupling unit 40. The local grounds TGND and RGND for the first coupling unit 20 and the second coupling unit 40 are not isolated from each other and therefore share a common ground 60, which is illustrated in FIG. 3a by a dashed line.

The first coupling unit 20 and the second coupling unit 40 each have a respective (single) antenna which encircles the twisted pair cable 10. Because the first coupling unit 20 has a single antenna, in use, it produces the same voltage in each of the twisted pairs in the twisted pair cable 10. Consequently, the first coupling unit 20 couples a common mode voltage signal to the twisted pair cable 10, rather than a voltage signal which propagates between the twisted pairs in the twisted pair cable 10.

When a common mode voltage signal is coupled to the twisted pair cable 10 by the first coupling unit 20, the return path for the common mode voltage signal is unclear. Consequently, the common mode voltage signal may flow out of the twisted pair cable 10 such that the common ground 60 acts as a return path for the common mode voltage signal. Interference 62 from other ground currents in the common ground 60 may interfere with the common mode voltage signal.

Consequently, the strength of a common mode voltage signal received by the second coupling unit 40 is not a definitive indicator that the first coupling unit 20 and second coupling unit 40 are interconnected by a twisted pair cable.

In any case, the coupling of a common mode voltage signal to the twisted pair cable 10 raises issues associated with electromagnetic compatibility, since common mode voltage signals are normally avoided and/or seen as a potential source of interference in twisted pair cables.

Figure 3B:
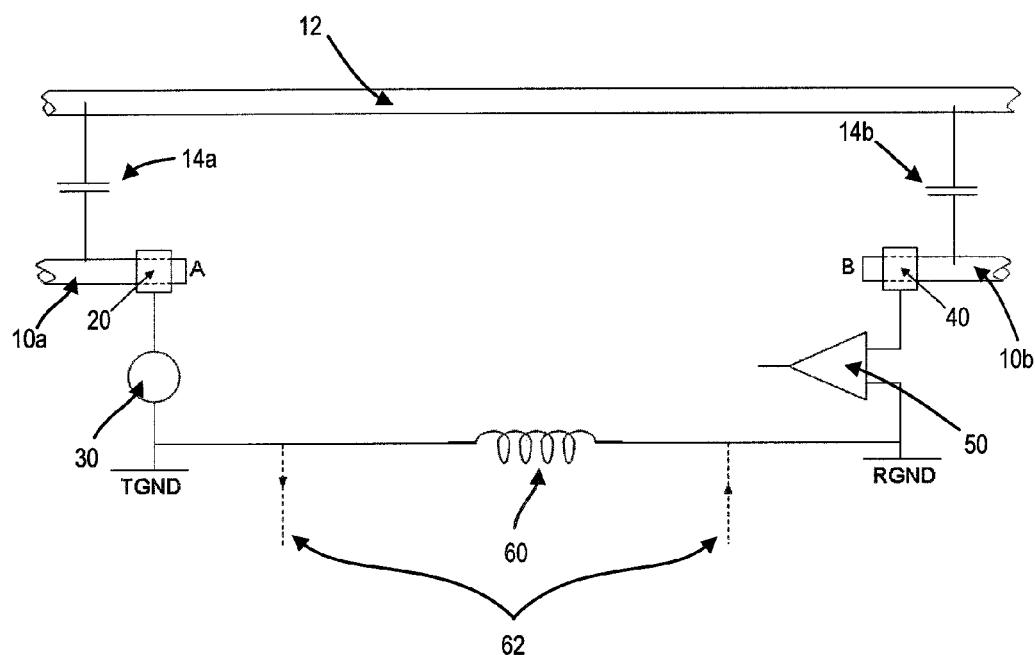

FIG. 3b shows the same apparatus as FIG. 3a, which has been modified to demonstrate a further problem associated with coupling a common mode voltage signal to and from the twisted pair cable 10. In FIG. 3b, the first coupling unit 20 is coupled to a first twisted pair cable 10a which is terminated by a port A. The second coupling unit 40 is coupled to a second twisted pair cable 10b which is terminated by a port B. A further twisted pair cable (not shown) can be coupled between the ports A and B to allow common mode voltage signals to propagate along the cable between the first coupling unit 20 and the second coupling unit 40. FIG. 3b also shows nearby twisted pair cables 12, which are capacitively coupled to the first and second twisted pair cables 10a and 10b. This coupling is represented in the FIG. 3b by a pair of capacitors 14a and 14b. In FIG. 3b, the common ground 60 is symbolically represented by an inductor.

As can be seen from FIG. 3b, if a common mode voltage signal propagates in the first twisted pair cable 10a, then the signal is not constrained to stay within the first twisted pair cable 10a because of the capacitive coupling with the nearby twisted pair cables 12. Therefore, the nearby twisted pair cables 12 provide an unwanted pathway for the common mode voltage signal to be transmitted from the first coupling unit 20 to the second coupling unit 40.

As a result, a common mode voltage signal from the first coupling unit 20 may be conveyed to the second coupling unit 40, even if a twisted pair cable is not connected between ports A and B. Consequently, the strength of a common mode voltage signal received by the second coupling unit 40 is not a definitive indicator that the ports A and B are interconnected by a twisted pair cable.

Figure 4:
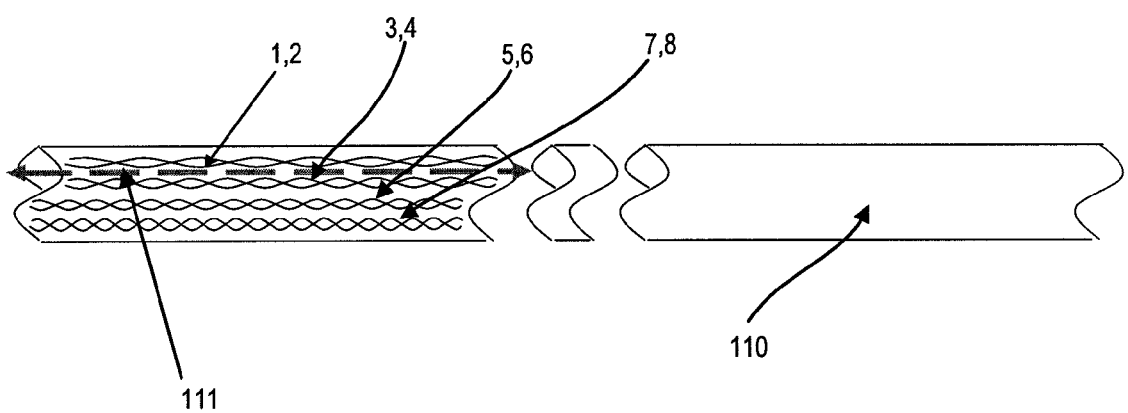
FIG. 4 is a representation illustrating the propagation of a voltage signal along a twisted pair cable between two twisted pairs in the twisted pair cable.

FIG. 4 illustrates the propagation of a voltage signal 111 along a twisted pair cable 110 between two twisted pairs in the twisted pair cable 110. The twisted pair cable 110 shown in FIG. 4 is an unshielded twisted pair cable, e.g. a category 5 or category 6 unshielded twisted pair cable, including eight conductors 1 to 8 which are twisted together in pairs to form four twisted pairs 1-2, 3-4, 5-6, 7-8.

As illustrated in FIG. 4, each twisted pair has a twist rate which is different from that of the other twisted pairs. The twisted pairs in the cable 110 are additionally twisted around each other, but for clarity, this is not illustrated in FIG. 4 (this additional twisting is shown in FIG. 5b).

As shown in FIG. 4, the voltage signal 111 propagates along the twisted pair cable 110 between the twisted pairs 1-2 and 3-4. The voltage signal 111 can be considered as the difference in voltage between the twisted pairs 1-2 and 3-4, e.g. as $((V1+V2)/2)-((V3+V4)/2)$, where V1 to V8 represents the voltages in conductors 1 to 8 with respect to a reference voltage.

Compared with the situation when a common mode voltage signal is coupled to a twisted pair cable, the voltage signal 111 has a more clearly defined channel through which it propagates, i.e. the pair-to-pair channel between the twisted pairs 1-2 and 3-4. Consequently, it is thought that the amount of leakage of the voltage signal 111 from the twisted pair cable 110, e.g. through coupling within any nearby cables, is reduced compared with a common mode voltage signal.

Because the twisted pair cable 110 includes four twisted pairs 1-2, 3-4, 5-6, 7-8, there are, in theory, six distinct pair-to-pair combinations of twisted pairs which could act as distinct communication channels for a voltage signal to propagate between two pairs. These combinations of twisted pairs are as follows:

Pairs 1-2 and 3-4;
Pairs 1-2 and 5-6;
Pairs 1-2 and 7-8;
Pairs 3-4 and 5-6;
Pairs 3-4 and 7-8; and
Pairs 5-6 and 7-8.

Each of these pair-to-pair combinations may have its own value of velocity of propagation and characteristic impedance, these values being determined by the geometry of the cable and the dielectric properties of any insulation used in the cable.

In practice, it has been found that significant cross-talk between the pair-to-pair channels within a twisted pair cable can occur such that, for a particular twisted pair cable, it may be desirable to couple only one voltage signal which propagates between the twisted pairs to the twisted pair cable 110 at any one time, this voltage signal being a combination, i.e. superposition, of voltage signals which propagate between all pair-to-pair combinations. However, the possibility of simultaneously conveying a plurality of voltage signals between different pair-to-pair combinations within a twisted pair cable is envisaged as a possibility.

Figure 5A:
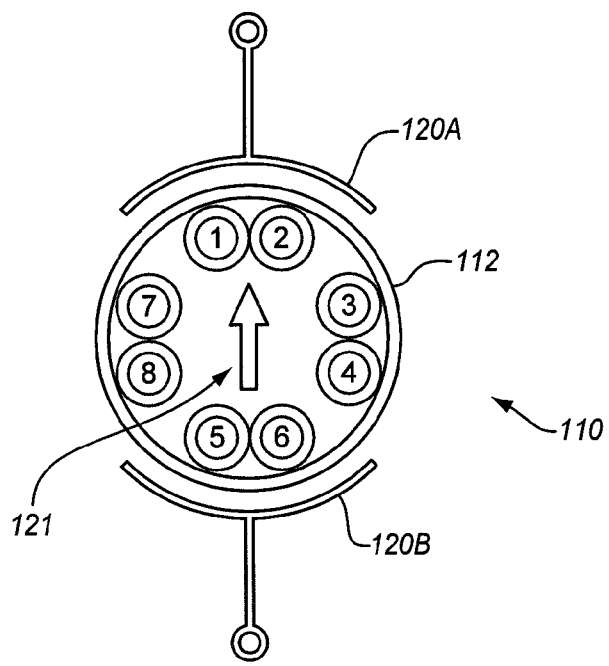
FIG. 5a is a representation of a pair of electrodes for coupling a voltage signal which propagates between twisted pairs to a twisted pair cable.
Figure 5B:
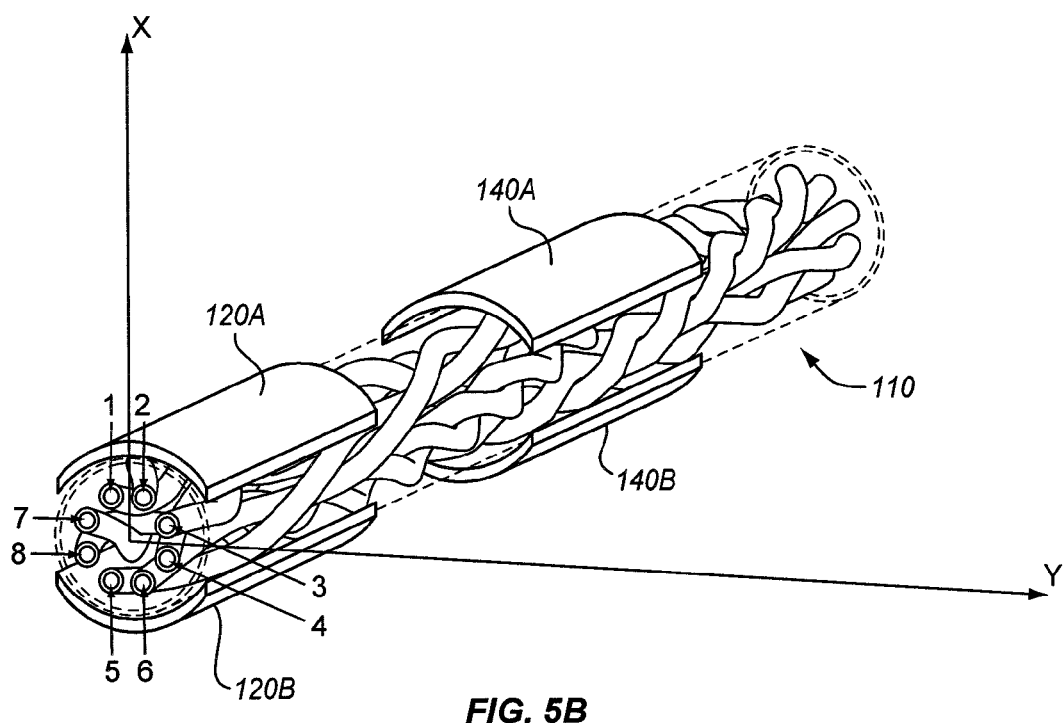

FIG. 5a shows a pair of electrodes 120a and 120b for coupling a voltage signal which propagates between twisted pairs to and from a twisted pair cable.

As shown in FIG. 5a, the first electrode 120a is provided in the form of a first plate and the second electrode 120b is provided 120b in the form of a second plate. The electrodes 120a and 120b together form a capacitor. In this example, the plates forming the first and second electrodes 120a, 120b are approximately 20 mm long and 8 mm wide. The plates may be made of any suitable material e.g. copper foil.

The first and second electrodes 120a and 120b are spaced apart to allow the cable 110 to be received therebetween, such that the electrodes 120a and 120b are located on directly opposite sides of the twisted pair cable 110. Each of the plates forming the electrodes 120a and 120b has an inwardly curved (i.e. concave) contact surface for contacting the convex outer surface 112, in this case an insulating sheath, of the twisted pair cable 110. The curvature of the contact surfaces of the plates conform to the curvature of the outer surface of the twisted pair cable 110 so that the electrodes 120a and 120b can be held in contact with the outer surface 112.

To couple a signal into the cable 110 by non-contact coupling with the twisted pairs, a voltage signal, e.g. from a voltage signal generator, may be coupled to the electrodes 120a, 120b so that a corresponding electric field is produced between the electrodes 120a, 120b. Because the electric field between the first and second electrodes 120a, 120b is different at twisted pairs 1-2 and 5-6, a voltage is developed between twisted pairs 1-2 and 5-6 which corresponds to the voltage signal coupled to the electrodes 120a, 120b. In this way, the voltage signal can be coupled to the cable 110 such that it propagates between at least twisted pairs 1-2 and 5-6.

The electrodes 120a, 120b may additionally or alternatively be used to receive a signal which has propagated between at least two of the twisted pairs in the twisted pair cable 110 by non-contact coupling with at least two of the twisted pairs between which the signal has propagated, as shall now be described with reference to a voltage signal that is propagating between the twisted pairs 1-2 and 5-6.

The voltage signal propagating between twisted pairs 1-2 and 5-6 of the cable 110 will have an electric field 121 between the twisted pairs 1-2 and 5-6 associated therewith. The electric field 121 may cause a voltage to be developed between the first and second electrodes 120a, 120b which corresponds to the voltage signal between the twisted pairs 1-2 and 5-6. In this way, the voltage signal can be received by the electrodes 120a, 120b.

FIG. 5b shows two of the pairs of the electrodes 120a, 120b and 140a, 140b shown in FIG. 5a. Electrodes 120a, 120b may be used as the electrodes of a first coupling unit for coupling a voltage signal to the cable 110 to propagate along the twisted pair cable 110 between at least two of the twisted pairs in the twisted pair cable 110. Electrodes 140a, 140b may be used as the electrodes of a second coupling unit for coupling the voltage signal from the twisted pair cable 110 after it has propagated along the twisted pair cable 110.

FIG. 5b also shows the twisted pair cable 110 of FIGS. 4 and 5a in more detail. As shown in FIG. 5b, not only is each twisted pair 1-2, 3-4, 5-6, 7-8 twisted at a twist rate which is different to that of the other twisted pairs, but all of the twisted pairs are additionally twisted around each other. This is typical in an unshielded twisted pair cable.

Because all the twisted pairs 1-2, 3-4, 5-6, 7-8 of the twisted pair cable 110 are twisted around each other, the electrodes 140a and 140b of the second coupling unit are not necessarily aligned to be adjacent to the same twisted pairs as the electrodes 120a and 120b of the first coupling unit. Consequently, the strength of the signal receivable by the electrodes 140a and 140b of the second coupling unit varies between maxima and minima according to their longitudinal position along the twisted pair cable 110. Varying the circumferential position of the electrodes 140a, 140b has a similar effect.

In practice, the inventors have found that a signal of adequate strength can often be received irrespective of the longitudinal/circumferential position of the electrodes 140a and 140b of the second coupling unit. However, the above-described maxima and minima effect may lead to "null" locations on the twisted pair cable at which the electrodes 140a and 140b of the second coupling unit cannot receive a signal. Thus, it may be necessary to adjust the longitudinal/circumferential position of the electrodes 140a and 140b of the second coupling unit in order to receive a signal having a desired strength.

An alternative solution, which avoids the need to adjust the longitudinal/circumferential position of the electrodes 140a and 140b of the second coupling unit, is to have two pairs of electrodes, i.e. four electrodes in total, for coupling a voltage signal to and/or from the twisted pair cable 110 (not shown). For example, if there are two pairs of electrodes for coupling the voltage signal from the twisted pair cable, an appropriate longitudinal separation between the two pairs of electrodes could be chosen to ensure that if the first pair of electrodes was in a "null" position, then the second pair of electrodes would be near a maximum. A detector and/or a switch could be used to allow the pair of electrodes receiving the largest signal to be selected, e.g. by a voltage signal processor.

Figure 6:
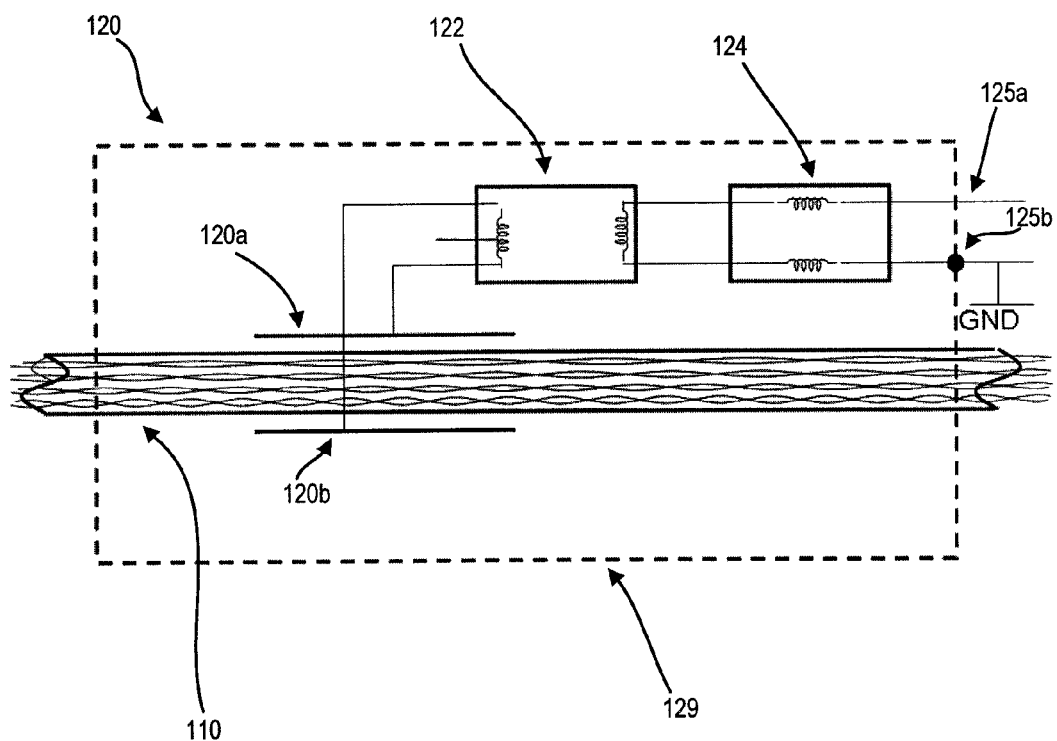
FIG. 6 is a representation of a coupling unit for coupling a voltage signal which propagates between twisted pairs to and/or from a twisted pair cable.

FIG. 6 shows a coupling unit 120 for coupling a voltage signal which propagates between at least two twisted pairs to and/or from the twisted pair cable 110 of FIGS. 4 and 5.

The coupling unit 120 includes a first electrode 120a and a second electrode 120b, which may be as described with reference to FIGS. 5a and 5b. The coupling unit 120 preferably includes a voltage signal coupling means which may include a first terminal 125a, a second terminal 125b, an electrical isolating means 122 in the form of a balun, and a converting means 124 in the form of a choke. The coupling unit 120 preferably includes shielding 129 in the form of an electrostatic screen which encloses the electrodes 120a, 120b, the electrical isolating means 122 and the converting means 124, and is preferably connected to the local ground GND. A suitable balun for the electrical isolating means 122 may be Mini-Circuits® type MCL506T2-T1. A suitable choke for the converting means 124 may be Mini-Circuits® type MCL750T1-1.

To couple a voltage signal to the twisted pair cable 110, the first terminal 125a may be connected to a voltage signal generator (not shown). The second terminal 125b may be connected to a local ground GND for the signal generator.

The voltage signal generated by the voltage signal generator may be a single-ended voltage signal which is converted into a differential voltage signal by the converting means 124, i.e. the choke, as is known to those skilled in the art. For example, if the signal generator produced a sinusoidal voltage expressed (in complex phasor notation) as $V.\exp(j\omega t)$; then the voltages outputted by the converting means 124 may be expressed as $V.\exp(j\omega t)/2$ and $-V.\exp(j\omega t)$. The differential voltage signal from the converting means 124 is then coupled to the electrodes 120a, 120b via the electrical isolating means 122, which electrically isolates the electrodes from the voltage signal generator.

As previously explained, the inventors have found that the quality of the voltage signal coupled to the twisted pair cable 110 by the coupling unit 120 can be improved significantly as a consequence of electrically isolating the electrodes 120a, 120b. In particular, it has been found that coupling the voltage signal to the twisted pair cable 110 by electrically isolated electrodes 120a, 120b can significantly reduce the amount of leakage of the voltage signal from the twisted pair cable 110, e.g. through neighbouring twisted pair cables.

To couple a voltage signal from the twisted pair cable 110, the first terminal 125a may be connected to a signal processor (not shown) for processing a voltage signal received by the electrodes 120a, 120b of the coupling unit 120. The second terminal 125b may be connected to a local ground GND for the signal processor.

The electrodes 120a, 120b of the coupling unit 120 may receive a voltage signal from the twisted pair cable 110 as previously described. The received voltage signal can then be coupled to the voltage signal processor via the balun 122 and the choke 124. The voltage signal received by the electrodes 120a, 120b may be a differential voltage signal which may be converted to a single-ended voltage by the converting means 124, i.e. the choke, as is known to those skilled in the art.

As previously explained, the inventors have found that the quality of the voltage signal coupled from the twisted pair cable 110 by the coupling unit 120 can be improved significantly as a consequence of electrically isolating the electrodes 120a, 120b.

Figure 7:
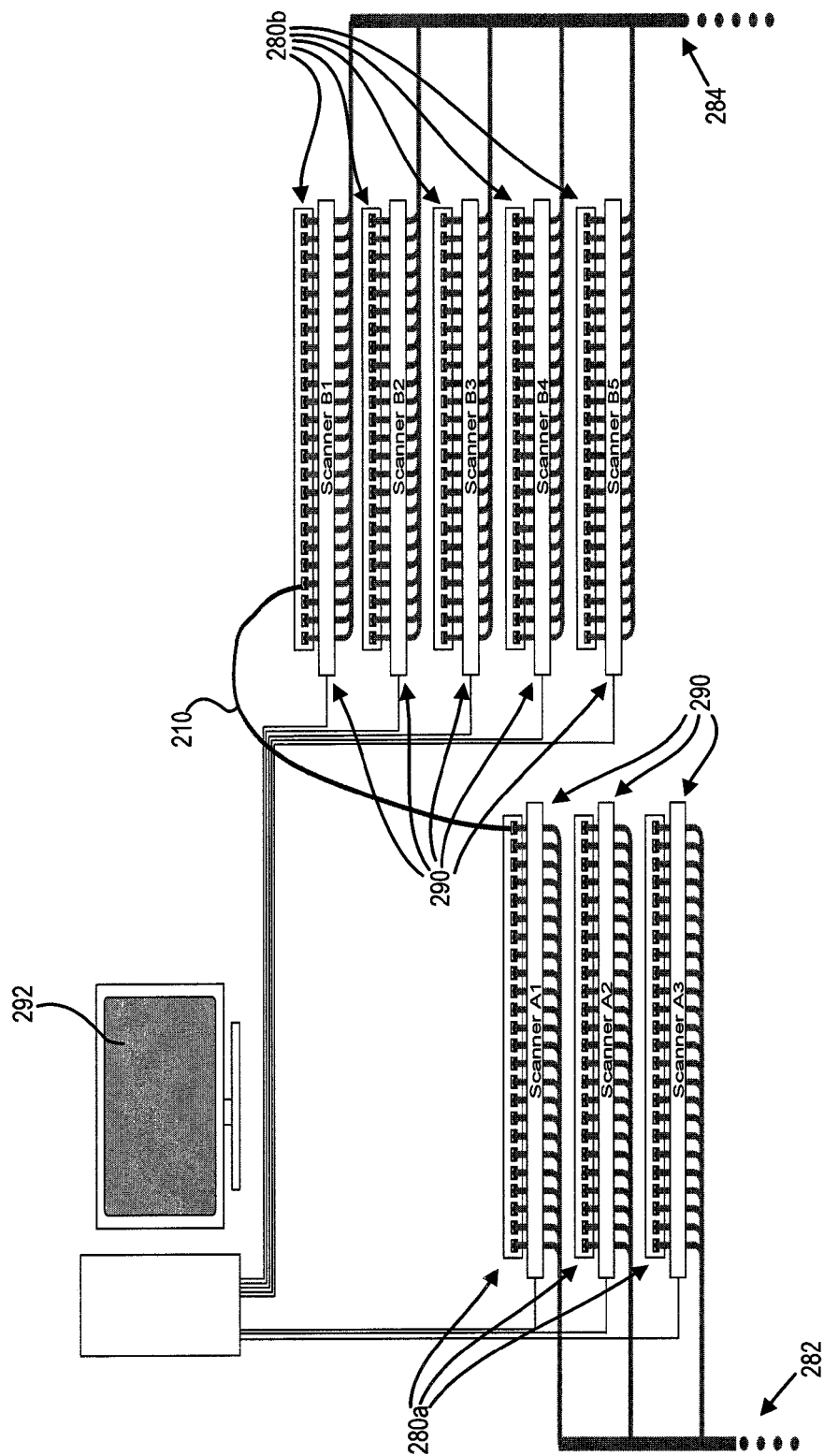
FIG. 7 is a representation of a network apparatus for identifying interconnections between network ports in a local area network.

FIG. 7 shows a network apparatus for identifying interconnections between network ports in a local area network.

The local area network shown in FIG. 7 includes a plurality of first patch panels 280a which are connected to server lines 282, and a plurality of second patch panels 280b which are connected to network lines 284. Each patch panel 280a, 280b has a plurality of network ports. The network ports of the first patch panels 280a and the network ports of the second patch panels 280b are interconnected by a plurality of patch cables 210. However, for clarity, only one of the patch cables 210 is illustrated in FIG. 7. In this example, each patch cable 210 is an unshielded twisted pair cable, e.g. a category 5 or category 6 unshielded twisted pair cable, including four twisted pairs.

The network apparatus shown in FIG. 7 includes a plurality of signal units 290 connected to a control unit 292 which is provided in the form of a suitably programmed computer. Each signal unit 290 is associated with a respective one of the patch panels 280a, 280b in the local area network. Each signal unit 290 may be held in place next to the patch panel 280 with which it is associated by any suitable means, e.g. cable ties, preferably so as to avoid applying excessive strain to the cables of the server lines 282 and network lines 284.

Figure 8:
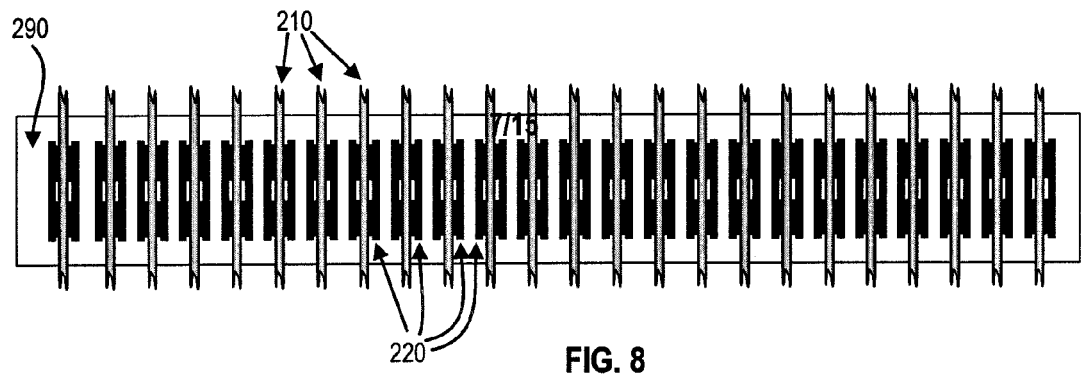
FIG. 8 is a representation of a signal unit of the network apparatus shown in FIG. 7.

FIG. 8 shows a signal unit 290 of FIG. 7 in more detail. As shown in FIG. 8, the signal unit 290 includes a plurality of coupling units 220 for coupling a voltage signal which propagates between twisted pairs to and from a patch cable. Each coupling unit 220 is associated with a respective network port in the patch panel with which its signal unit 290 is associated.

Figure 9:
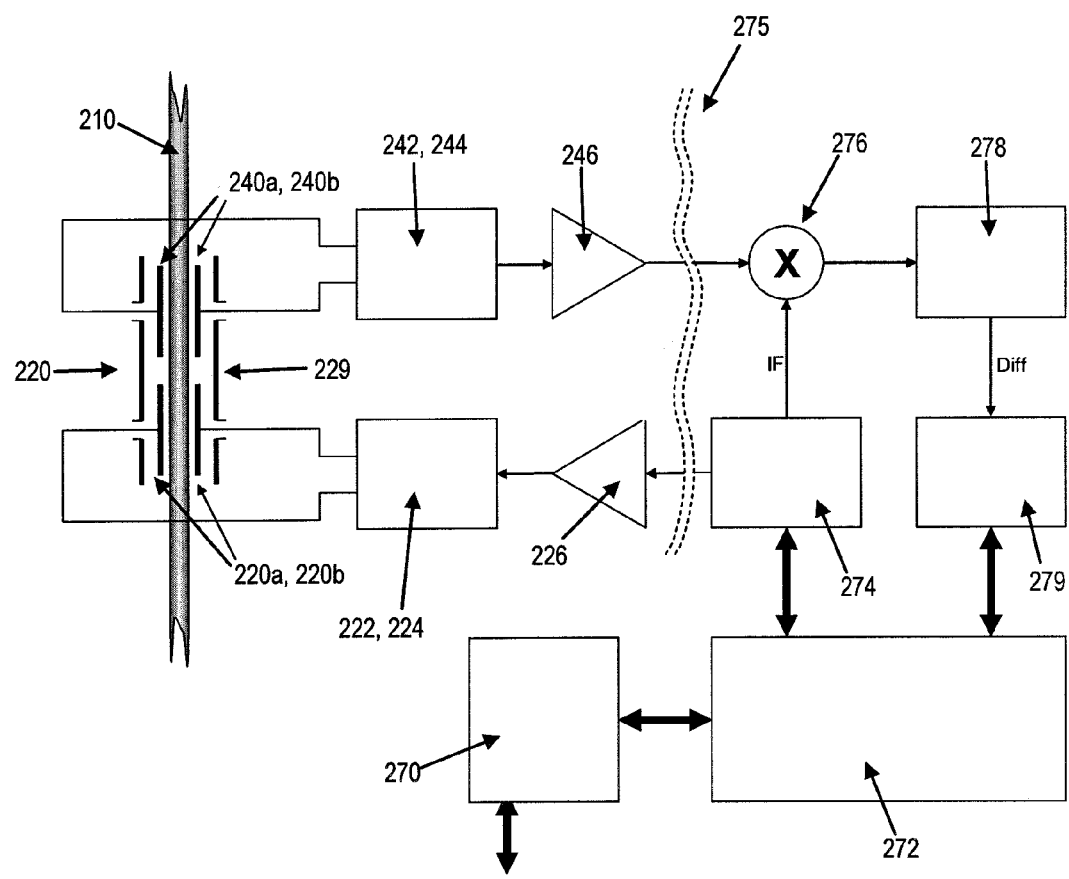
FIG. 9 is a representation of a coupling unit and circuitry associated with the coupling unit in the signal unit of FIG. 8.

FIG. 9 shows a coupling unit 220 and the circuitry associated with the coupling unit 220 in the signal unit 290 of FIG. 8.

As shown in FIG. 9, the coupling unit 220 includes a first pair of electrodes 220a, 220b for coupling a voltage signal to the patch cable 210, a second pair of electrodes 240a, 240b for coupling a voltage signal from the patch cable 210, and shielding 229. The shielding 229 separates the first pair of electrodes 220a, 220b from the second pair of electrodes 240a, 240b and reduces direct coupling between the first pair of electrodes 220a, 220b and the second pair of electrodes 240a, 240b. The shielding also shields the electrodes from external electromagnetic fields, e.g. from nearby patch cables 210 and nearby coupling units 220.

The coupling unit 220 preferably has a housing arranged to be clipped on to one of the patch cables 210 (e.g. by way of a suitable channel in the coupling unit or suitable retention lugs) such that the first pair of electrodes 220a, 220b and the second pair of electrodes 240a, 240b contact an outer surface of the patch cable 210. The first pair of electrodes 220a, 220b are preferably located on directly opposite sides of the cable 210. Likewise the second pair of electrodes 240a, 240b are preferably located on directly opposite sides of the cable 210.

For coupling a voltage signal to a patch cable 210 via the first pair of electrodes 220a, 220b, the coupling unit 220 further has an electrical isolating means 222 in the form of a balun, a converting means 224 in the form of a choke, and an amplifier 226. The first pair of electrodes 220a, 220b, the electrical isolating means 222 and the converting means 224 may be similar to those described with reference to FIGS. 5 and 6. FIG. 9 shows the electrical isolating means 222, the converting means 224 and the amplifier 226 of the coupling unit 220 as not being housed in the housing of the coupling unit 220. However, it is equally possible for these components to be housed in the housing of the coupling unit 220, e.g. as shown in FIG. 6.

The circuitry in a signal unit 290 for coupling a voltage signal from a patch cable 210 via the second pair of electrodes 240a, 240b includes an electrical isolating means 242 in the form of a balun, a converting means 244 in the form of a choke, and an amplifier 246. The second pair of electrodes 240a, 240b, the electrical isolating means 222 and the converting means 224 may be similar to those described with reference to FIGS. 5 and 6. FIG. 9 shows the electrical isolating means 242, the converting means 244 and the amplifier 246 of the coupling unit 220 as not being housed in the housing of the coupling unit 220. However, it is equally possible for these components to be housed in the housing of the coupling unit 220, e.g. as shown in FIG. 6.

The circuitry in the signal unit 290 preferably includes one or more of a processor 270, a field programmable gate array 272, a direct signal synthesizer 274, a multiplexer 275, a multiplier 276, a low pass filter and amplifier 278, and an analogue to digital converter 279 all of which are preferably connected as shown in FIG. 9. The processor 270 is preferably connected to, and controlled by, the control unit 292 of FIG. 7. The multiplier 276, low pass filter and amplifier 278, analogue to digital converter 279, field programmable gate array 272 and processor 270 of the signal unit 290 may be shared by the all coupling units 220 in the signal unit 290.

The processor 270, field programmable gate array 272, direct signal synthesizer 274 and multiplexer 275 together form a voltage signal generator arranged to generate a voltage signal to be coupled to a patch cable 210 by the electrodes 220a, 220b of the coupling unit 220. The processor 270, multiplexer 275, multiplier 276, low pass filter and amplifier 278, and analogue to digital converter 279 together form a voltage signal processor arranged to process a voltage signal coupled from the patch cable 210 by the electrodes 240a, 240b of the coupling unit 220.

The voltage signal generator may be arranged to generate a single-ended voltage signal to be supplied to the coupling unit 220. Preferably, the voltage signal generator is arranged to selectably generate either a data signal or to generate a test signal for determining the state of the cable 210.

When the voltage signal generator generates a data signal, the direct signal synthesizer 274 is preferably controlled by the field programmable gate array 272 and processor 270 to generate a data signal containing address data to identify the coupling unit 220. There are many approaches for modulating and coding the data signal between coupling units, which are well known to those skilled in the art. In some embodiments, the data signal is generated using frequency shift keying modulation, e.g. by generating a carrier signal having a first frequency to represent "0" and a second frequency to represent "1". To improve the discrimination of the signal from interference or spurious coupling from other cables, the data signal could be transmitted over several frequencies using spread spectrum techniques.

When the voltage signal generator is in use to generate a test signal, the direct signal synthesizer 274 is preferably controlled by the field programmable gate array 272 and processor 270 to generate a standard reflectometry signal according to any technique well known in the art. Such techniques include, but are not limited to, time domain reflectometry, frequency domain reflectometry and techniques involving the generation of other wideband signals such as pseudo random noise. These techniques can be used to determine the position and nature of changes in the characteristic impedance of the pair-to-pair channel within the patch cables 210. Such changes in impedance typically result from end-connections, cable connections, faults and other discontinuities.

Once generated, the single-ended voltage signal from the direct signal synthesiser 274 is multiplexed by the multiplexer 275, amplified by the amplifier 226, and is then converted into a differential voltage signal and coupled to the patch cable 210 by the converting means 224, the electrical isolating means 222 and the first pair of electrodes 220a, 220b of the coupling unit 220 in same way as described above with reference to FIGS. 5 and 6, i.e. such that the voltage signal propagates between at least two of the twisted pairs in the patch cable 210.

When a voltage signal which propagates between the twisted pairs propagates along the cable 210 to the coupling unit 220, the voltage signal is received and converted into a single-ended voltage signal by the second pair of electrodes 240a, 240b, the converting means 242 and the electrical isolating means 244 of the coupling unit 220 in the same way as described above with reference to FIGS. 5 and 6. The single-ended voltage signal is then amplified by the amplifier 246, demultiplexed by the multiplexer 275, demodulated by the multiplier 276 and the low pass filter and amplifier 278 and is then passed to the analogue to digital converter 279 where it is converted into a digital signal. A final stage of demodulation is performed by the field programmable gate array 272 and the signal is then passed to the processor 270.

In the case of a data signal being received by the coupling unit 220, the processor 270 can identify the coupling unit 220 which coupled the data signal to the patch cable 210 by retrieving the address data contained therein. This information can then be supplied to the control unit 292, which can use the information to determine interconnections by the patch cables 210 between the network ports in the local area network shown in FIG. 7.

The control unit 292 may be programmed to control the signal units 290 to determine the interconnections between the network ports in the local area network according to any suitable scheme. For example, the control unit 292 may control each signal unit 290 to be in either a transmit mode or a receive mode. In the transmit mode, each coupling unit 220 in the signal unit 290 couples a data signal containing address data to identify the coupling unit 220. In the receive mode, each coupling unit 220 in the signal unit 290 waits to see if it receives a data signal from a coupling unit 220 of a signal unit 290 in transmission mode. Based on address data retrieved by the processors 270 of signal units 290 in the receive mode, the control unit 292 can determine which network ports are interconnected by patch cables 210 in the local area network. However, as would be appreciated by the skilled person, there are many possible schemes that could be used to determine the interconnections within the local area network.

An advantage of using the network apparatus shown in FIG. 7 to determine the interconnections between the network ports in a local area network is that it can be retrofitted to an existing local area network without requiring substantial modification of that local area network. In particular, it is not necessary to install specially adapted patch cables or patch panels and the transmission of signals within the twisted pairs of each patch cable need not be interrupted.

In the case of a test signal being received by the coupling unit 220, the processor 270 can determine a state of the cable 210, e.g. by comparing the received signal with a reference signal, as is known in the art in standard reflectometry techniques. Such techniques are explained, for example, in International Patent Application publication number WO2005/109015. In one example, a reference signal is recorded when the network is known to be in a good operation. A signal measured by a coupling unit can subsequently be compared with the reference signal to determine whether a fault condition has occurred. The control unit 292 may be suitably arranged to control the signal units 290 to continually or intermittently determine the state of the patch cables 210. Reflectometry techniques generally involve the receiving of reflected signals, and therefore the test signal may be coupled to and from a patch cable 210 by the same coupling unit 220.

Local area networks vary widely in scale and complexity. For example, the local area network shown in FIG. 7 may include "cross-connect" patch panels located between the first patch panels 280a and the second patch panels 280b. The network apparatus may therefore be extended and/or modified according to the local area network with which it is to be used.

In the above described network apparatus, each coupling unit 220 houses a first pair of electrodes 220a, 220b for coupling a voltage signal to a patch cable 210 and a second pair of electrodes 240a, 240b for coupling a voltage signal from a patch cable 210. In other possible arrangements, each coupling unit 220 may be provided only with a single pair of electrodes. This may reduce costs. The single pair of electrodes may, for example, be arranged only to couple a voltage signal to a patch cable or only to couple a voltage signal from a patch cable. Alternatively, the single pair of electrodes may be arranged to both couple a voltage signal to a patch cable and to couple a voltage signal from a patch cable.

In some arrangements, the signal units 290 may be provided with coupling units 220 arranged only to couple a voltage signal to a patch cable or only to couple a voltage signal from a patch cable. However, it is preferred for each signal units 290 to have coupling units 220 able to couple a signal to and from a patch cable 210, e.g. as shown in FIG. 9, since this allows the signal units 290 to communicate in two directions.

Also, coupling units 220 arranged to couple a signal to and from a patch cable 210 may be particularly useful for reflectometry, as they can both send test signals and receive the reflected test signals. The circuitry required for reflectometry may be expensive. Therefore, it may be preferable to provide only a small number of signal units 290 which have the circuitry required for reflectometry positioned on the server lines of a local area network, as generally only the state of live cables in a local area network need to be monitored.

It is typical for a patch panel to have twenty-four network ports. Therefore, each signal unit 290 may therefore have twenty-four coupling units 220. However, the number of coupling units 220 within each signal unit 290 may be modified according to the patch panels with which the signal unit 290 is to be used.

Although the data signals described above contain address data, the signal units 290 could equally be used to send other types of data through the patch cables 210. Accordingly, the signal units 290 could be used to provide communications channels which are additional to those contained within each twisted pair in the patch cables 210.

To help in the understanding of the present invention, the following examples are presented.

EXAMPLE 1

To investigate the nature of the propagation of a voltage signal propagating between twisted pairs in a cable including a plurality of twisted pairs, an unshielded twisted pair cable including four twisted pairs was modelled.

Three dimensional finite element models were used to determine all capacitance and inductance parameters of the unshielded twisted pair cable. These capacitance and inductance values were fed into an equivalent circuit model of the unshielded twisted pair cable.

Figure 10A:
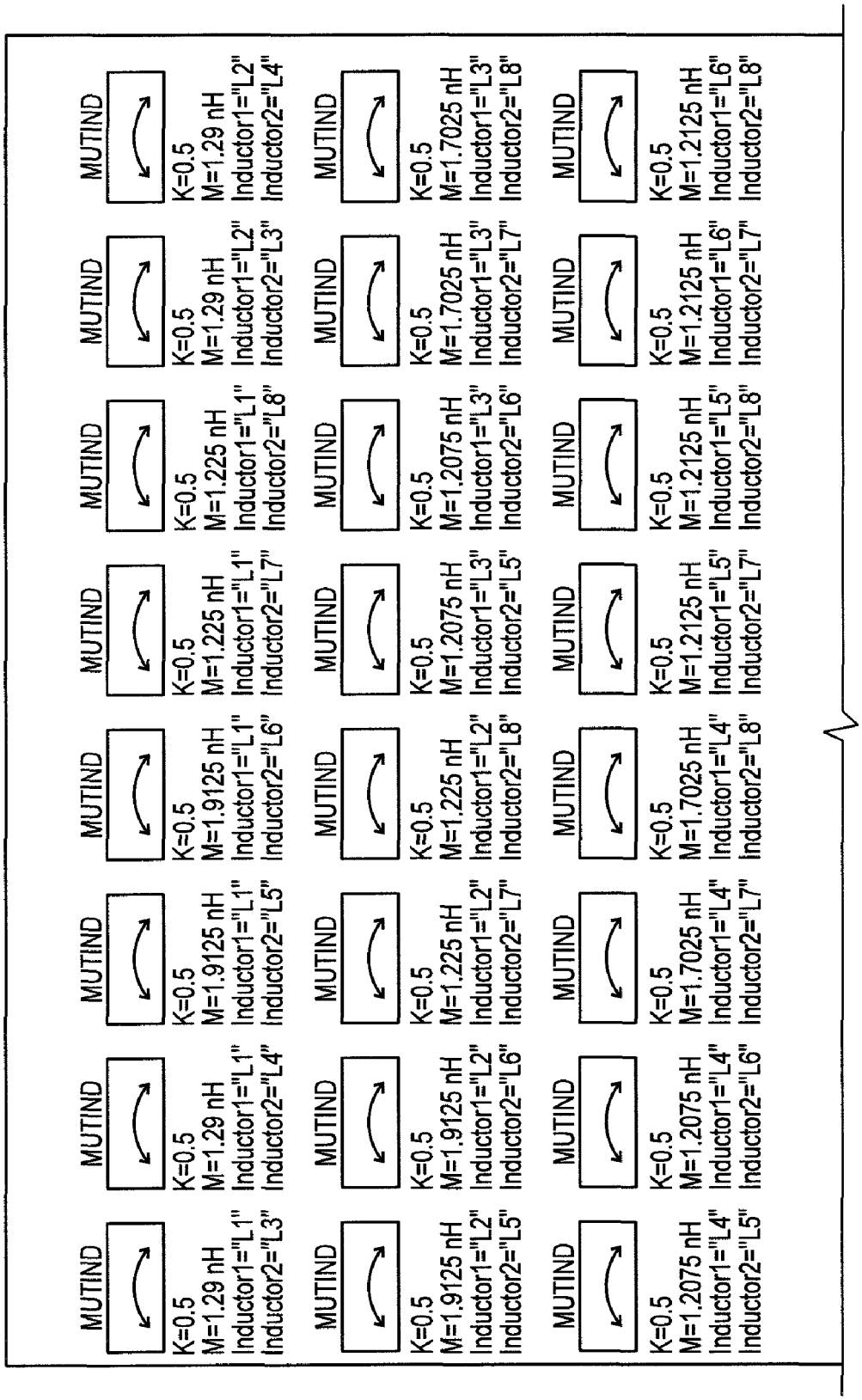
FIG. 10 is a representation of an equivalent circuit model of a short elemental section of a twisted pair cable.
Figure 10B:
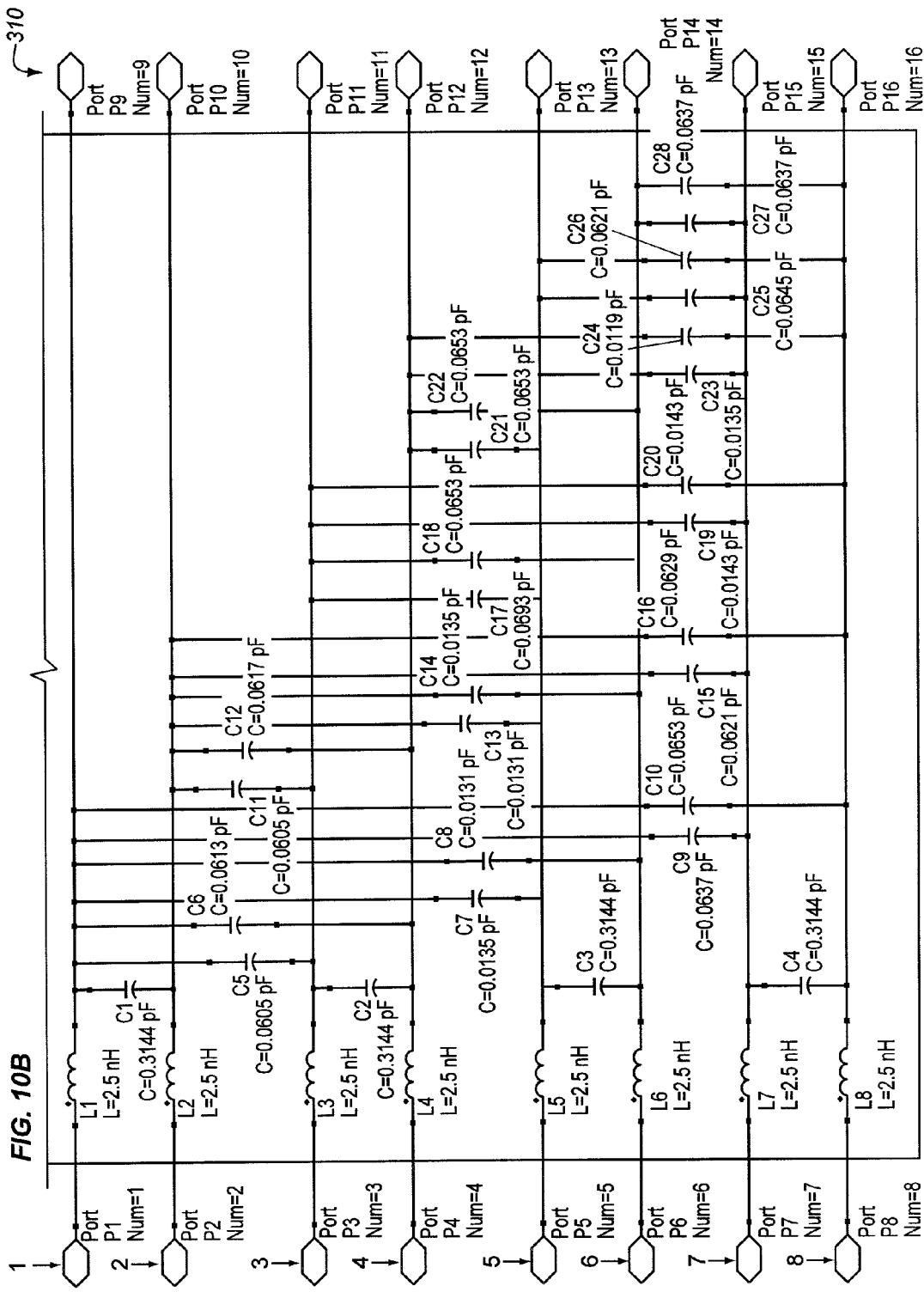

FIG. 10 shows the equivalent circuit model of a short elemental section of an unshielded twisted pair cable 310 including eight conductors 1 to 8 which have been twisted together in pairs to form four twisted pairs 1-2, 3-4, 5-6, 7-8. Such elemental sections can be connected end to end to model any length of an unshielded twisted pair cable including four twisted pairs. In addition, transmitters and receivers can be added to complete the system, which can then be analysed using a circuit modelling tool such as SPICE ("Simulation Program with Integrated Circuit Emphasis"). Such modelling tools are well known by persons skilled in the art.

Figure 11:
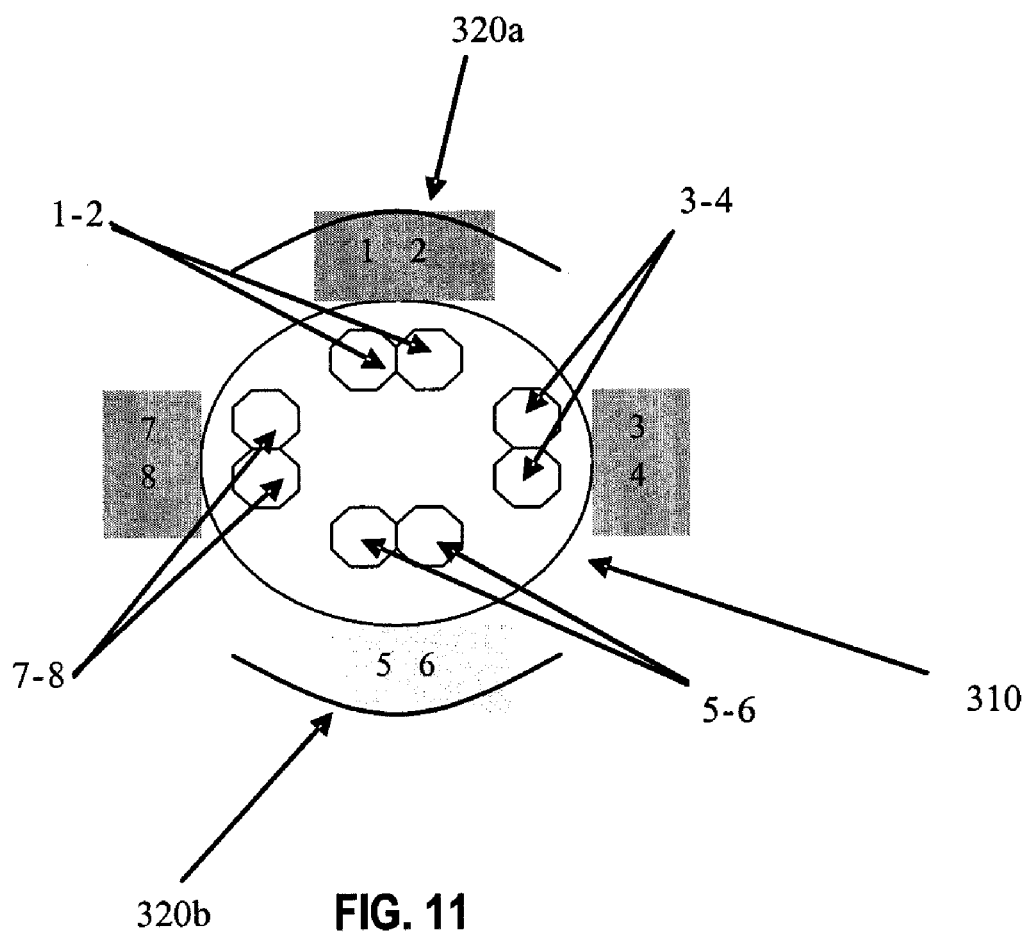
FIG. 11 is a representation of a twisted pair cable to be modelled using the equivalent circuit model of FIG. 10.

FIG. 11 shows a twisted pair cable 310 that was modelled using the equivalent circuit model of FIG. 10, along with two electrodes 320a and 320b for coupling a voltage signal to the twisted pair cable 310 so that the voltage signal propagates between at least two of the twisted pairs in the cable, e.g. as described previously. As shown in FIG. 11, the electrodes 320a and 320b are adjacent the twisted pairs 1-2 and 5-6 and are therefore arranged to couple a voltage signal to the cable so that the voltage signal propagates between at least the twisted pairs 1-2 and 5-6.

As illustrated by FIG. 11, there are six pair-to-pair combinations within the twisted pair cable 310, namely:

Pairs 1-2 and 3-4
Pairs 1-2 and 5-6
Pairs 1-2 and 7-8
Pairs 3-4 and 5-6
Pairs 3-4 and 7-8
Pairs 5-6 and 7-8

Figure 12A:
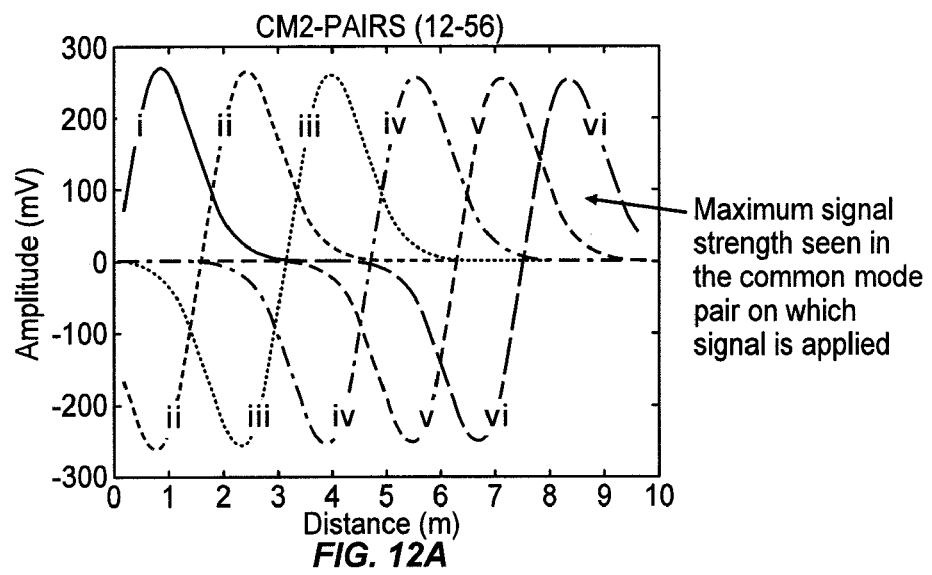
FIGS. 12a-c are graphs showing the signal propagation along a twisted pair cable modelled using the equivalent circuit model of FIG. 10.
Figure 12B:
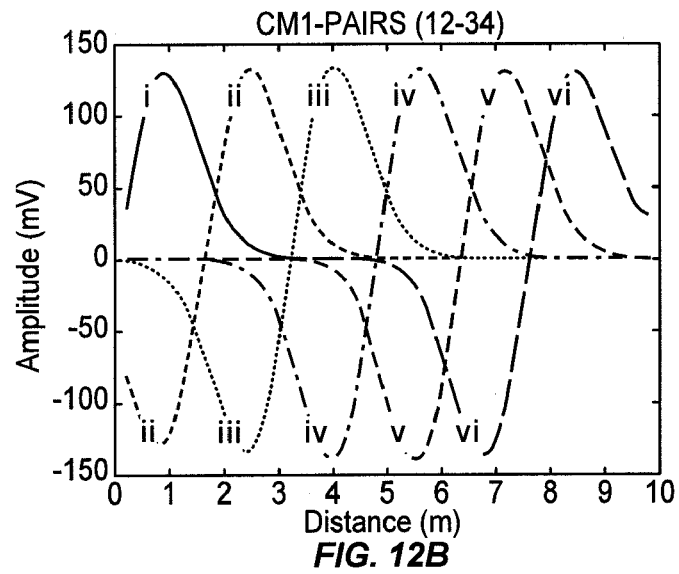
Figure 12C:
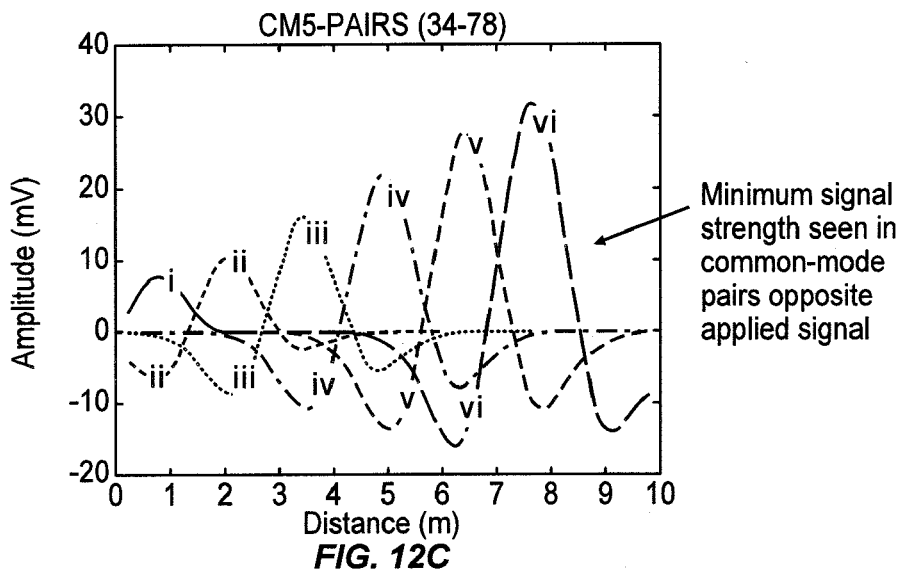

FIGS. 12a-c show the simulated voltage signal propagation along the twisted pair cable 310 shown in FIG. 11. FIG. 12a shows the simulated voltage signal propagation between pairs 1-2 and 5-6. FIG. 12b shows the simulated voltage signal propagation between pairs 1-2 and 3-4. FIG. 12c shows the simulated voltage signal propagation between pairs 3-4 and 7-8. Within each pair-to-pair combination, individual voltage signals are labelled i-vi. In all cases, the delay between each voltage signal was 7.5 ns.

The voltage signals between pairs 1-2 and 7-8, pairs 3-4 and 5-6, and pairs 5-6 and 7-8, are not shown for brevity but, owing to symmetry, would be the same as or very similar to the voltage signals between pairs 1-2 and 3-4 shown in FIG. 12b.

As can be seen from FIGS. 12a and 12b, the voltage signals between pairs 1-2 and 5-6 (which are adjacent to the electrodes 320a and 320b of the transmitter) are approximately twice as strong as the voltage signals between pairs 1-2 and 3-4. As can be seen from FIG. 12c, the voltage signals between pairs 3-4 and 7-8 are much smaller, but increase with distance along the twisted pair cable 310. This shows that the voltage signals propagating between twisted pairs 1-2 and 5-6 have leaked on to other pair-to-pair channels such as the channel defined by twisted pairs 3-4 and 7-8.

EXAMPLE 2

Figure 13:
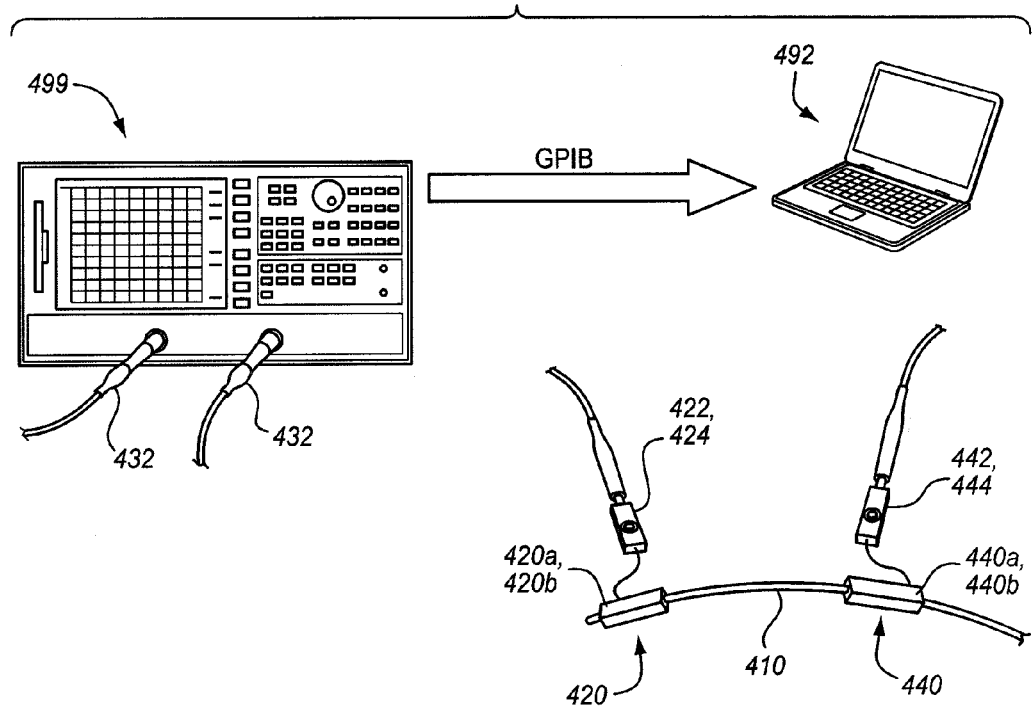
FIG. 13 is a representation of a test apparatus for coupling a voltage signal which propagates between twisted pairs to and from a twisted pair cable.

FIG. 13 shows a test apparatus for coupling a voltage signal which propagates between twisted pairs to and from a twisted pair cable, which in this case is an unshielded twisted pair patch cable 410.

The apparatus of FIG. 13 has a first coupling unit 420 for coupling a voltage signal to the patch cable 410, a second coupling unit 440 for coupling a voltage signal from the patch cable 410, a computer 492 and a vector network analyser 499. The vector network analyser 499 is controlled by the computer 492 and is connected to the first coupling unit 420 and the second coupling unit 440 by two signal leads 432. The computer 492 is programmed with signal processing and analysis software for controlling the vector network analyser to apply a frequency sweep, acquiring the resultant in-phase and quadrature signal components, and analysing this data with an inverse fourier transform to produce time domain reflectometry plots.

The first coupling unit 420 includes two electrodes 420a and 420b, a balun 422 and a choke 424, in an arrangement corresponding to that shown in FIG. 6. The first coupling unit 420 is connected to the vector network analyser 499 via one of the signal leads 432. The balun 422 is a 50:100 Ohms device.

The second coupling unit 440 includes two electrodes 440a and 440b, a balun 442 and a choke 444, in an arrangement corresponding to that shown in FIG. 6. The second coupling unit 440 is connected to the vector network analyser 499 by the other of the signal leads 432. The balun 422 is a 50:100 Ohms device.

FIGS. 14, 15 and 16 are time domain reflectometry plots produced using the apparatus of FIG. 13. To produce these plots, time domain reflectometry was performed under a variety of different conditions. In all examples, the patch cable 410 was a 10 meter unshielded twisted pair cable containing four twisted pairs and terminated with an RJ45 type connector.

Figure 14A:
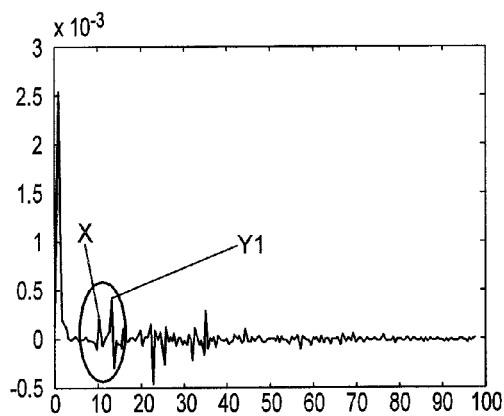
FIGS. 14, 15 and 16 are time domain reflectometry plots produced using the test apparatus of FIG. 13.
Figure 14B:
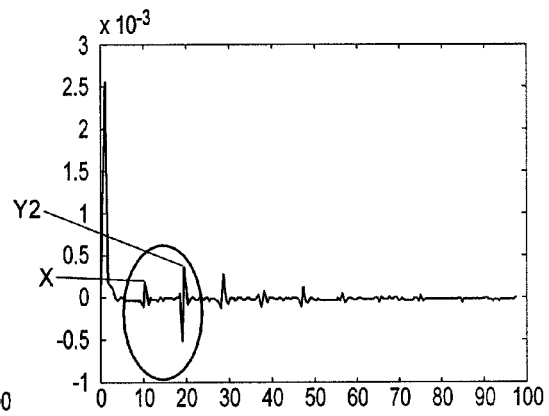

To produce the plot shown in FIG. 14a the patch cable 410 was connected to an (unterminated) additional 3 meter unshielded twisted pair patch cable. In FIG. 14a the reflections caused by the RJ45 type connector and the end of the additional patch cable are both clearly visible and are marked X and Y1 respectively. To produce the plot shown in FIG. 14b, the patch cable 410 was connected to an (unterminated) additional 10 meter unshielded twisted pair patch cable. In FIG. 14b, the reflections caused by the RJ45 type connector and the end of the additional patch cable are both clearly visible and are marked X and Y2 respectively.

Figure 15A:
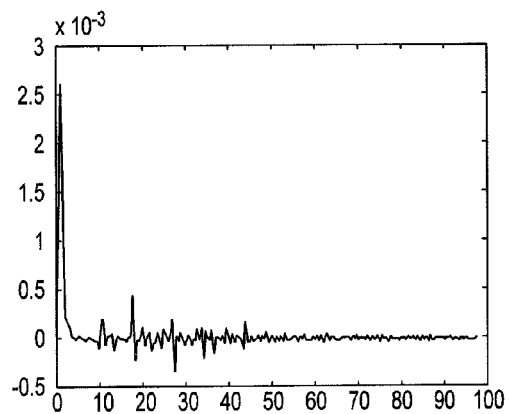
Figure 15B:
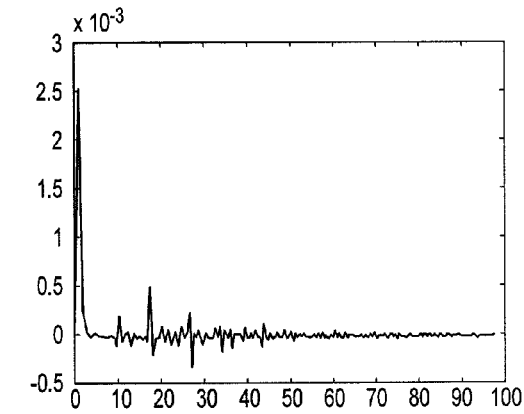

To produce the plots shown in FIGS. 15a and 15b, the cable 410 was connected to an additional 10 meter unshielded twisted pair patch cable. For FIG. 15a, the additional patch cable was unterminated, whereas for FIG. 15b, each of the four twisted pairs in the additional patch cable was terminated with a 100 Ohm termination. The value of 100 Ohm was chosen because it matched the characteristic impedance of each twisted pair in the additional patch cable. These terminations should therefore attenuate differential voltage signals which propagate within, rather than between, the twisted pairs in the twisted pair cables.

By comparing the plots of FIGS. 15a and 15b, it can be seen that the time domain reflectometry plot is unaffected by the presence of the 100 Ohm resistor terminations. This indicates that the voltage signal coupled to the twisted pair cable 410 by the first coupling unit 420 does not include, at least not to a significant extent, differential voltage signals which propagate within the twisted pairs of the twisted pair cable 410, because the 100 Ohm terminations has a negligible effect on the measured signal.

Figure 16A:
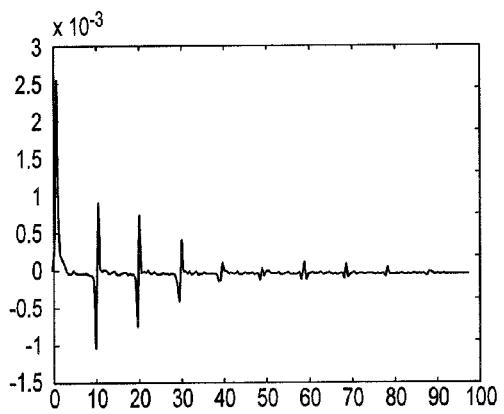
Figure 16B:
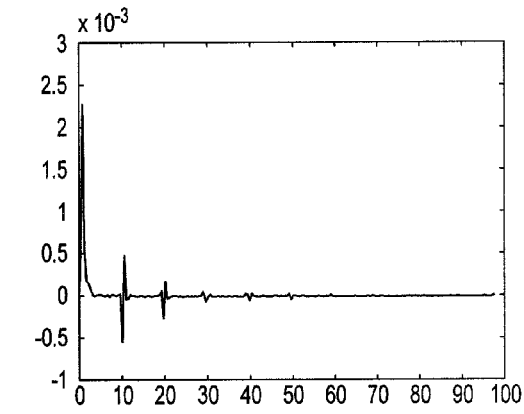
Figure 17:
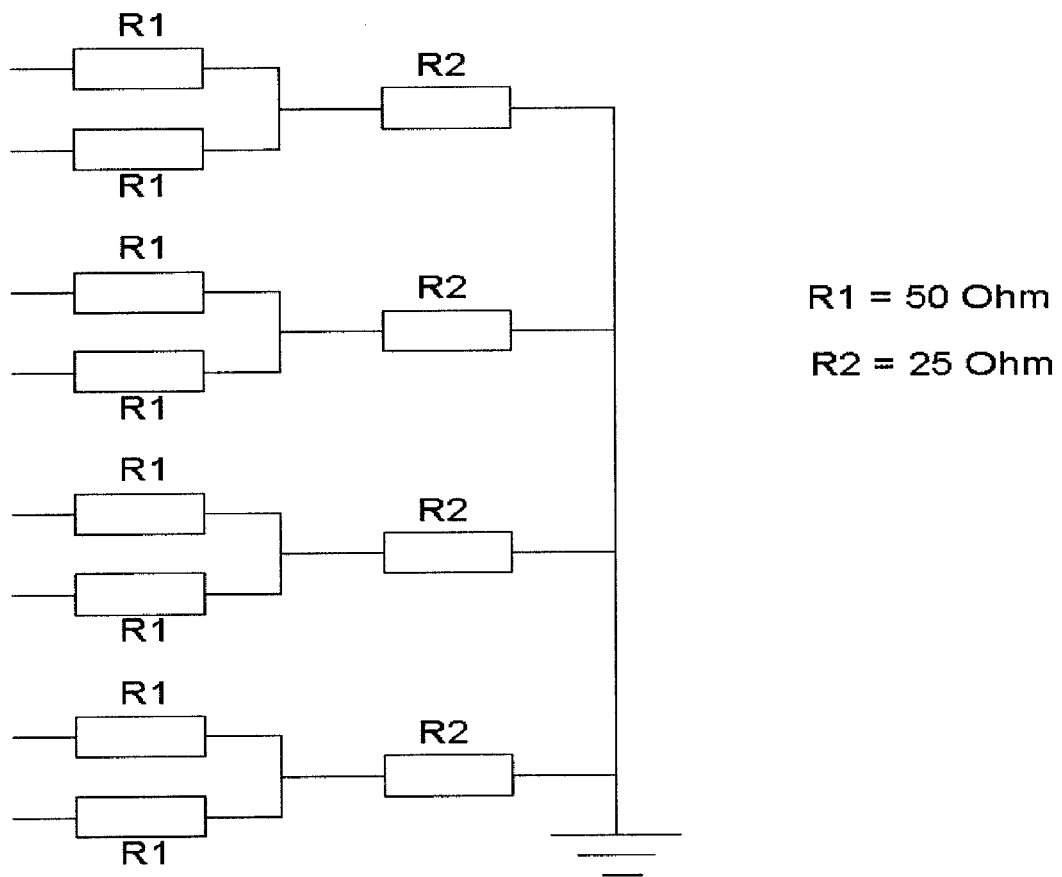
FIG. 17 is a representation of a matched inter-pair termination resistor network used to produce the reflectometry plot of FIG. 16b.

To produce the plots shown in FIGS. 16a and 16b, the cable 410 was connected to and terminated by an additional 10 meter unshielded twisted pair patch cable. For FIG. 16a, the additional patch cable was unterminated, whereas for FIG. 16b, each of the four twisted pairs in the additional patch cable was terminated by a matched inter-pair termination resistor network, which is shown in FIG. 17. By comparing the plots of FIGS. 16a and 16b, it can be seen that the reflections caused by the RJ45 type connector and the additional patch cable are significantly reduced in the case of FIG. 16b. This indicates that the voltage signal from the first coupling unit is largely propagating between at least two twisted pairs in the patch cables.

One of ordinary skill after reading the foregoing description will be able to affect various changes, alterations, and subtractions of equivalents without departing from the broad concepts disclosed. It is therefore intended that the scope of the patent granted hereon be limited only by the appended claims, as interpreted with reference to the description and drawings, and not by limitation of the embodiments described herein.

The following statements provide examples of general expressions of the disclosure herein.

A. A coupling unit for coupling a voltage signal to and/or from a cable including a plurality of twisted pairs, the coupling unit having:
  a first electrode and a second electrode arranged to produce an electric field therebetween to couple a voltage signal to the cable by non-contact coupling with the twisted pairs so that the voltage signal propagates along the cable between at least two of the twisted pairs and/or arranged to receive a voltage signal which has propagated along the cable between at least two of the twisted pairs by non-contact coupling with at least two of the twisted pairs between which the voltage signal has propagated; and
  a voltage signal coupling means for coupling a voltage signal generated by a voltage signal generator to the electrodes and/or for coupling a voltage signal received by the electrodes to a voltage signal processor;
  wherein the voltage signal coupling means includes electrical isolation means arranged to electrically isolate the electrodes of the coupling unit from the voltage signal generator and/or the voltage signal processor.

B. A coupling unit according to statement A wherein the electrical isolation means includes a balun.

C. A coupling unit according to statement A or B wherein the coupling unit includes shielding for shielding the electrodes from an external electromagnetic field.

D. A coupling unit according to any one of the previous statements wherein the voltage signal coupling means includes a converting means for converting a single-ended voltage signal from a voltage signal generator into a differential voltage signal to be coupled to the electrodes and/or for converting a differential voltage signal from the electrodes into a single-ended voltage signal to be coupled to a voltage signal processor.

E. A coupling unit according to statement D wherein the electrical isolating means electrically isolates the electrodes from the converting means.

F. A coupling unit according to statement D or E wherein the converting means includes a choke.

G. A coupling unit according to any one of the previous statements wherein the coupling unit has housing in which the electrodes, and optionally any one or more of the voltage signal coupling means, the electrical isolating means, the shielding and the converting means, is housed.

H. A coupling unit according to statement G wherein the electrodes are spaced apart by the housing to allow the cable to be received therebetween.

I. A coupling unit according to statement G or H wherein the electrodes are spaced apart by the housing so as to be located on directly opposite sides of the cable when the cable is received therebetween.

J. A coupling unit according to any one of statements G to I wherein the housing is arranged to be clipped on to the cable.

K. A coupling unit according to statement J wherein the electrodes are located in the housing so as to contact an outer surface of the cable if the housing is clipped onto the cable.

L. A coupling unit according to any one of the previous statements wherein each electrode includes a respective contact surface for contacting an outer surface of the cable.

M. A coupling unit according to statement L wherein each contact surface substantially conforms in shape to an outer surface of the cable.

N. A coupling unit according to any one of the previous statements wherein the coupling unit includes a third electrode and a fourth electrode, which are spaced apart from the first and second electrodes and arranged to produce an electric field therebetween to couple the voltage signal to the cable by non-contact coupling with the twisted pairs so that the voltage signal propagates between at least two of the twisted pairs and/or arranged to receive a voltage signal which has propagated along the cable between at least two of the twisted pairs by non-contact coupling with at least two of the twisted pairs between which the voltage signal has propagated.

O. A coupling unit according to any one of the previous statements wherein:
   the first electrode and the second electrode are arranged to produce an electric field therebetween to couple a voltage signal to the cable by non-contact coupling with the twisted pairs so that the voltage signal propagates along the cable between at least two of the twisted pairs;
   the voltage signal coupling means is for coupling a voltage signal generated by a voltage signal generator to the electrodes; and
   the electrical isolation means is arranged to electrically isolate the electrodes of the coupling unit from the voltage signal generator.

P. A coupling unit according to statement O having:
   a first additional electrode and a second additional electrode arranged to receive a voltage signal which has propagated along the cable between at least two of the twisted pairs by non-contact coupling with at least two of the twisted pairs between which the voltage signal has propagated; and
   a voltage signal coupling means for coupling a voltage signal received by the additional electrodes to a voltage signal processor;
   wherein the voltage signal coupling means includes electrical isolation means arranged to electrically isolate the additional electrodes of the coupling unit from the voltage signal processor.

Q. A coupling unit according to any one of statements A to N wherein:
   the first electrode and the second electrode are arranged to receive a voltage signal which has propagated along the cable between at least two of the twisted pairs by non-contact coupling with at least two of the twisted pairs between which the voltage signal has propagated;
   the voltage signal coupling means is for coupling a voltage signal received by the electrodes to a voltage signal processor; and
   the electrical isolation means is arranged to electrically isolate the electrodes of the coupling unit from the voltage signal processor.

R. An apparatus having:
   a coupling unit according to any one of the previous statements; and
   a voltage signal generator;
   wherein the voltage signal coupling means couples the voltage signal generator to the electrodes of the coupling unit.

S. An apparatus according to statement R wherein the voltage signal generator is arranged to generate a data signal which contains data.

T. An apparatus according to statement S wherein the data signal contains address data to identify the coupling unit.

U. An apparatus according to any one of statements R to T wherein the voltage signal generator is arranged to generate a test signal for determining a state of the cable.

V. An apparatus according to statement U wherein the test signal is suitable for performing time domain reflectometry or frequency domain reflectometry.

W. An apparatus having:
   a coupling unit according to any one of the previous statements; and
   a voltage signal processor;
   wherein the voltage signal coupling means couples the voltage signal processor to the electrodes of the coupling unit.

X. An apparatus according to statement W wherein the signal processor includes a data retrieving means for retrieving data from a data signal received by the receiver.

Y. An apparatus according to statement W or X wherein the signal processor is arranged to determine a state of a cable based on a test signal received by the receiver.

Z. An apparatus having:
   a cable including a plurality of twisted pairs;
   a first coupling unit for coupling a voltage signal to the cable as set out in any previous statement;
   a second coupling unit for coupling a voltage signal from the cable as set out in any previous statement.

ZA. An apparatus according to statement Z wherein the cable is an unshielded twisted pair cable.

ZB. An apparatus for coupling a signal to and from a cable including a plurality of twisted pairs, the apparatus having:
   a first coupling unit arranged to couple a signal to the cable by non-contact coupling with the twisted pairs so that the signal propagates along the cable between at least two of the twisted pairs; and
   a second coupling unit arranged to receive the signal which has propagated along the cable by non-contact coupling with at least two of the twisted pairs between which the signal has propagated.

ZC. An apparatus according to statement ZB wherein the signal is a voltage signal.

ZD. An apparatus according to statement ZC wherein the first coupling unit is arranged such that the voltage signal which propagates between at least two of the twisted pairs has an average voltage which corresponds to the average voltage in the conductors which form the twisted pairs.

ZE. An apparatus according to statement ZD wherein the first coupling unit is arranged such that the voltage signal which propagates between at least two of the twisted pairs has an average voltage which tracks the average voltage in the conductors which form the twisted pairs over time.

ZF. An apparatus according to any one of statements ZC to ZE wherein the first coupling unit has a first electrode and a second electrode arranged to produce an electric field therebetween to couple a voltage signal to the cable by non-contact coupling with the twisted pairs so that the voltage signal propagates along the cable between at least two of the twisted pairs.

ZG. An apparatus according to statement ZF wherein the first coupling unit is a coupling unit for coupling a voltage signal to a cable including a plurality of twisted pairs as set out in any one of statements A to ZA.

ZH. An apparatus according to statement ZG wherein the electrical isolating means is omitted.

ZI. An apparatus according to any one of statements ZC to ZH wherein the second coupling unit has a first electrode and a second electrode arranged to receive a voltage signal which has propagated along the cable between at least two of the twisted pairs by non-contact coupling with at least two of the twisted pairs between which the voltage signal has propagated.

ZJ. An apparatus according to statement ZI wherein the second coupling unit is a coupling unit for coupling a voltage signal from a cable including a plurality of twisted pairs as set out in any one of statements A to ZB.

ZK. An apparatus according to statement ZJ wherein the electrical isolating means is omitted.

ZL. A first coupling unit for coupling a signal to a cable including a plurality of twisted pairs as set out in any one of statements ZB to ZK.

ZM. A second coupling unit for coupling a signal from a cable including a plurality of twisted pairs as set out in any one of statements ZB to ZK.

ZN. An apparatus having:
  one or more first coupling units for coupling a signal to a cable including a plurality of twisted pairs so that the signal propagates along the cable between at least two of the twisted pairs;
  one or more second coupling units for coupling a signal which has propagated between at least two twisted pairs from a cable including a plurality of twisted pairs; and
  an interconnection determining means arranged to determine one or more interconnections between any one of the first coupling units and any one of the second coupling units by one or more cables including a plurality of twisted pairs;
  wherein each of the one or more first coupling units is as set out in any one of statements A to ZA or ZL, and/or each of the one or more second coupling units is as set out in any one of statements A to ZA or ZM.

ZO. An apparatus according to statement ZN wherein the interconnection determining means is arranged to determine an interconnection between one of the first coupling units and one of the second coupling units by determining if the second coupling unit couples a signal from a cable which has been coupled to the cable by the first coupling unit.

ZP. An apparatus according to statement ZN or ZO wherein each of the one or more first coupling units is arranged to couple to the cable a data signal containing address data to identify the first coupling unit.

ZQ. An apparatus according to any one of statements ZN to ZP wherein each of the one or more first coupling units and each of the one or more second coupling units is associated with a respective network port in a local area network, and the interconnection determining means is arranged to determine one or more interconnections between the network ports by one or more cables including a plurality of twisted pairs.

ZR. An apparatus according to any one of statements ZN to ZQ wherein the network apparatus includes one or more signal units, each signal unit including:
  a plurality of the first coupling units; and/or
  a plurality of the second coupling units.

ZS. A signal unit as set out in statement ZR.

ZT. A method of coupling a voltage signal to and/or from a cable including a plurality of twisted pairs, the method including:
  producing an electric field to couple a voltage signal to the cable by non-contact coupling with the twisted pairs so that the voltage signal propagates along the cable between at least two of the twisted pairs; and/or
  receiving a voltage signal which has propagated along the cable between at least two of the twisted pairs by non-contact coupling with at least two of the twisted pairs between which the voltage signal has propagated.

ZU. A method of coupling a signal to and from a cable including a plurality of twisted pairs, the method including:
  coupling a signal to the cable by non-contact coupling with the twisted pairs so that the signal propagates along the cable between at least two of the twisted pairs; and
  receiving the signal which has propagated along the cable by non-contact coupling with at least two of the twisted pairs between which the signal has propagated.

ZV. A coupling unit, apparatus or signal unit substantially as herein described, with reference to and as shown in FIGS. 4 to 6, FIGS. 7 to 9, FIGS. 10 to 12 or FIGS. 13 to 17.

What is claimed is:

1. An apparatus for coupling a voltage signal to and from a cable including a plurality of twisted pairs, the apparatus having:
  a first coupling unit having a first electrode and a second electrode arranged to produce an electric field therebetween to couple a voltage signal to the cable by non-contact coupling with the twisted pairs so that the voltage signal propagates along the cable between at least two of the twisted pairs, the first coupling unit also having a voltage signal coupling means for coupling a voltage signal generated by a voltage signal generator to the first and second electrodes of the first coupling unit, wherein the first and second electrodes of the first coupling unit are provided in the form of plates; and
  a second coupling unit arranged to receive the voltage signal which has propagated along the cable by non-contact coupling with at least two of the twisted pairs between which the voltage signal has propagated.

2. An apparatus according to claim 1 wherein the first coupling unit is arranged such that the voltage signal which propagates between at least two of the twisted pairs has an average voltage which corresponds to the average voltage in the conductors which form the twisted pairs.

3. An apparatus according to claim 2 wherein the first coupling unit is arranged such that the voltage signal which propagates between at least two of the twisted pairs has an average voltage which tracks the average voltage in the conductors which form the twisted pairs over time.

4. An apparatus according to claim 1 wherein the second coupling unit has a first electrode and a second electrode arranged to receive a voltage signal which has propagated along the cable between at least two of the twisted pairs by non-contact coupling with at least two of the twisted pairs between which the voltage signal has propagated.

5. An apparatus according to claim 4 wherein the second coupling unit is a coupling unit for coupling a voltage signal from a cable including a plurality of twisted pairs, the coupling unit having:
- a first electrode and a second electrode arranged to receive a voltage signal which has propagated along the cable between at least two of the twisted pairs by non-contact coupling with at least two of the twisted pairs between which the voltage signal has propagated; and
- a voltage signal coupling means for coupling a voltage signal received by the first and second electrodes of the second coupling unit to a voltage signal processor.

6. An apparatus according to claim 5, wherein the first and second electrodes of the second coupling unit are provided in the form of plates.

7. An apparatus according to claim 1 wherein the first coupling unit and the second coupling unit are the same coupling unit.

8. An apparatus according to claim 1, wherein the apparatus includes:
- a plurality of the first coupling units;
- a plurality of the second coupling units; and
- an interconnection determining means arranged to determine one or more interconnections between any one of the first coupling units and any one of the second coupling units by one or more cables including a plurality of twisted pairs.

9. An apparatus according to claim 8 wherein the interconnection determining means is arranged to determine an interconnection between one of the first coupling units and one of the second coupling units by determining if the second coupling unit couples a voltage signal from a cable which has been coupled to the cable by the first coupling unit.

10. An apparatus according to claim 8 wherein each of the one or more first coupling units is arranged to couple to the cable a data voltage signal containing address data to identify the first coupling unit.

11. An apparatus according to claim 8 wherein each of the one or more first coupling units and each of the one or more second coupling units is associated with a respective network port in a local area network, and the interconnection determining means is arranged to determine one or more interconnections between the network ports by one or more cables including a plurality of twisted pairs.

12. An apparatus according to claim 8 wherein the network apparatus includes one or more signal units, each signal unit including:
- a plurality of the first coupling units; and/or
- a plurality of the second coupling units.

13. A method of coupling a voltage signal to and from a cable including a plurality of twisted pairs, the method including:
- generating a voltage signal at a voltage signal generator;
- coupling the voltage signal to a first electrode and a second electrode of a first coupling unit via a voltage signal coupling means of the first coupling unit, wherein the first and second electrodes of the first coupling unit are provided in the form of plates;
- producing an electrode field between the first and second electrodes of the first coupling unit so as to couple the voltage signal to the cable by non-contact coupling with the twisted pairs so that the voltage signal propagates along the cable between at least two of the twisted pairs;
- receiving, at a first electrode and a second electrode of a second coupling unit, the voltage signal which has propagated along the cable by non-contact coupling with at least two of the twisted pairs between which the signal has propagated, wherein the first and second electrodes of the second coupling unit are provided in the form of plates; and
- coupling the voltage signal received by the first and second electrodes of the second coupling unit to a voltage signal processor via a voltage signal coupling means of the second coupling unit.

14. An apparatus for coupling a voltage signal to and from a cable including a plurality of twisted pairs, the apparatus having:
- a first coupling unit arranged to couple a voltage signal to the cable by non-contact coupling with the twisted pairs so that the voltage signal propagates along the cable between at least two of the twisted pairs; and
- a second coupling unit having a first electrode and a second electrode arranged to receive the voltage signal which has propagated along the cable by non-contact coupling with at least two of the twisted pairs between which the voltage signal has propagated, the second coupling unit having a voltage signal coupling means for coupling a voltage signal received by the first and second electrodes of the second coupling unit to a voltage signal processor, wherein the first and second electrodes of the second coupling unit are provided in the form of plates.

* * * * *